United States Patent
Han et al.

(10) Patent No.: US 11,941,212 B2
(45) Date of Patent: Mar. 26, 2024

(54) TOUCH DISPLAY DEVICE

(71) Applicant: LG Display Co., Ltd., Seoul (KR)

(72) Inventors: Jonghyun Han, Paju-si (KR); YeonGyeong Bae, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/530,259

(22) Filed: Nov. 18, 2021

(65) Prior Publication Data

US 2022/0164065 A1   May 26, 2022

(30) Foreign Application Priority Data

Nov. 26, 2020 (KR) .................. 10-2020-0161337

(51) Int. Cl.
*G06F 3/044* (2006.01)
*G06F 3/041* (2006.01)

(52) U.S. Cl.
CPC .......... *G06F 3/0446* (2019.05); *G06F 3/0412* (2013.01); *G06F 3/04164* (2019.05); *G06F 2203/04112* (2013.01)

(58) Field of Classification Search
CPC .. G06F 2203/04111; G06F 2203/04112; G06F 3/0412; G06F 3/04164; G06F 3/0443; G06F 3/0445; G06F 3/0446
See application file for complete search history.

(56) References Cited

U.S. PATENT DOCUMENTS

| | | | | |
|---|---|---|---|---|
| 2019/0187852 A1* | 6/2019 | Jin | ........................ | G06F 3/047 |
| 2019/0204953 A1* | 7/2019 | Min | .................... | G06F 3/0445 |
| 2019/0339818 A1* | 11/2019 | Rhe | .................... | G06F 3/04164 |
| 2021/0240302 A1* | 8/2021 | Kim | .................... | G06F 3/0446 |
| 2021/0357074 A1* | 11/2021 | Xu | ...................... | G06F 3/04164 |
| 2022/0027035 A1* | 1/2022 | Yoon | .................. | G06F 3/04164 |

* cited by examiner

*Primary Examiner* — Robin J Mishler

(74) *Attorney, Agent, or Firm* — Seed IP Law Group LLP

(57) ABSTRACT

Embodiments of the present disclosure are related to a touch display device, as disposing a plurality of touch pads located on a plurality of lines alternatively and making a metal other than the touch pad not to expose to outside, the number of the touch pads being capable of disposing on a pad area can be increased and a reliability of the touch pad can be maintained. Furthermore, as disposing pad lines, electrically connected to the touch pad and located adjacently, on different layers, a short between adjacent pad lines can be prevented and a space between the touch pads can be reduced or minimized, a disposition structure of the touch pad can be implemented easily according to increasing the number of channels in a large size of the touch display device.

25 Claims, 18 Drawing Sheets

TOUCH DISPLAY DEVICE

CROSS REFERENCE TO RELATED APPLICATION

This application claims priority from Korean Patent Application No. 10-2020-0161337, filed on Nov. 26, 2020, which is hereby incorporated by reference for all purposes as if fully set forth herein.

BACKGROUND

Technical Field

Embodiments of the present disclosure are related to a touch display device.

Description of the Related Art

The growth of the information society leads to increased demand for display devices to display images and use of various types of display devices, such as liquid crystal display devices, organic light emitting display devices, etc.

The display devices, for providing more various functions to a user, provide a function that recognizes a touch by a finger or a pen of the user being contacted to a display panel and performs an input process based on a recognized touch.

The display devices can comprise a plurality of touch electrodes disposed on the display panel, or imbedded in the display panel. And the display devices can sense a touch of the user to the display panel by detecting a change of a capacitance occurred by the touch of the user.

The number of channels for driving the touch electrode disposed in the display panel can increase as increasing a size of the display device. The number of pads disposed in the display panel can increase according to increasing the number of channels.

BRIEF SUMMARY

Based on the above trend in the related art, the inventors of the present disclosure have recognized that it may be beneficial to be capable of arranging a large number of pads in a restricted area of the display panel, and maintaining a reliability. In this regard, one or more embodiments of the present disclosure provide methods being capable of increasing the number of a touch pad for connecting between a touch routing line and a touch driving circuit in a touch display device capable of sensing a touch.

Further embodiments of the present disclosure can provide methods being capable of maintaining a reliability in an area where a touch pad is disposed while increasing the number of the touch pad disposed in a display panel. The embodiments also provide a device or an apparatus incorporating the aforementioned methods.

In an aspect, embodiments of the present disclosure can provide a touch display device including a plurality of touch electrodes located on an active area of a display panel and disposed on an encapsulation layer disposed on the active area, a plurality of touch link lines located outside of the active area and electrically connected to at least one of the plurality of touch electrodes, a plurality of pad lines electrically connected to each of the plurality of touch link lines, and a plurality of touch pads electrically connected to each of the plurality of pad lines.

The plurality of touch pads can include a plurality of first touch pads located on a first line and electrically connected to each of a plurality of first pad lines, among the plurality of pad lines, disposed on a same layer as a layer where at least a portion of the plurality of touch link lines is disposed, and a plurality of second touch pads located on a second line located farther from the plurality of touch link lines than the first line and electrically connected to each of a plurality of second pad lines, among the plurality of pad lines, disposed on a different layer from a layer where the plurality of first pad lines are disposed.

Alternatively, the plurality of touch pads can include a plurality of first touch pads located on a first line and electrically connected to each of a plurality of first pad lines of the plurality of pad lines, and a plurality of second touch pads located on a second line located farther from the plurality of the touch link lines than the first line and electrically connected to each of a plurality of second pad lines, among the plurality of pad lines, disposed on a same layer as a layer where the plurality of first pad lines area disposed.

The plurality of first pad lines and the plurality of second pad lines may not be exposed to outside.

Alternatively, in some cases, the plurality of touch pads can include a plurality of first touch pads located on a first line, and electrically connected to each of a plurality of first pad lines, among the plurality of pad lines, disposed on a same layer as a layer where the first touch pad is disposed, a plurality of second touch pads located on a second line located farther from the plurality of touch link lines than the first line, and electrically connected to each of a plurality of second pad lines, among the plurality of pad lines, disposed on a different layer from a layer where the plurality of first pad lines are disposed, and a plurality of third touch pads located on a third line located farther from the plurality of touch link lines than the second line, and electrically connected to each of a plurality of third pad lines, among the plurality of pad lines, including a first portion disposed on a same layer as a layer where at least one of the plurality of first pad lines and the plurality of second pad lines is disposed and a second portion disposed on a different layer from a layer where the plurality of first pad lines and the plurality of second pad lines are disposed.

According to various embodiments of the present disclosure, as disposing a touch pad connected to a touch routing line on a plurality of lines, the number of the touch pads disposed in a display panel can be increased.

According to various embodiments of the present disclosure, as a pad line connecting between a touch pad and a touch routing line is not exposed to outside on an area where the touch pad is disposed, a reliability can be maintained on the area where the touch pad is disposed.

According to various embodiments of the present disclosure, as implementing a pad line connected to an adjacent touch pad by using a metal disposed on a different layer, a short between adjacent pad lines can prevented and a space increase between touch pads can be reduced or minimized, and the number of the touch pads disposed in the display panel can be increased.

BRIEF DESCRIPTION OF THE SEVERAL VIEWS OF THE DRAWINGS

The above and other features, and advantages of the present disclosure will be more clearly understood from the following detailed description, taken in conjunction with the accompanying drawings, in which.

DETAILED DESCRIPTION

Figure 1:
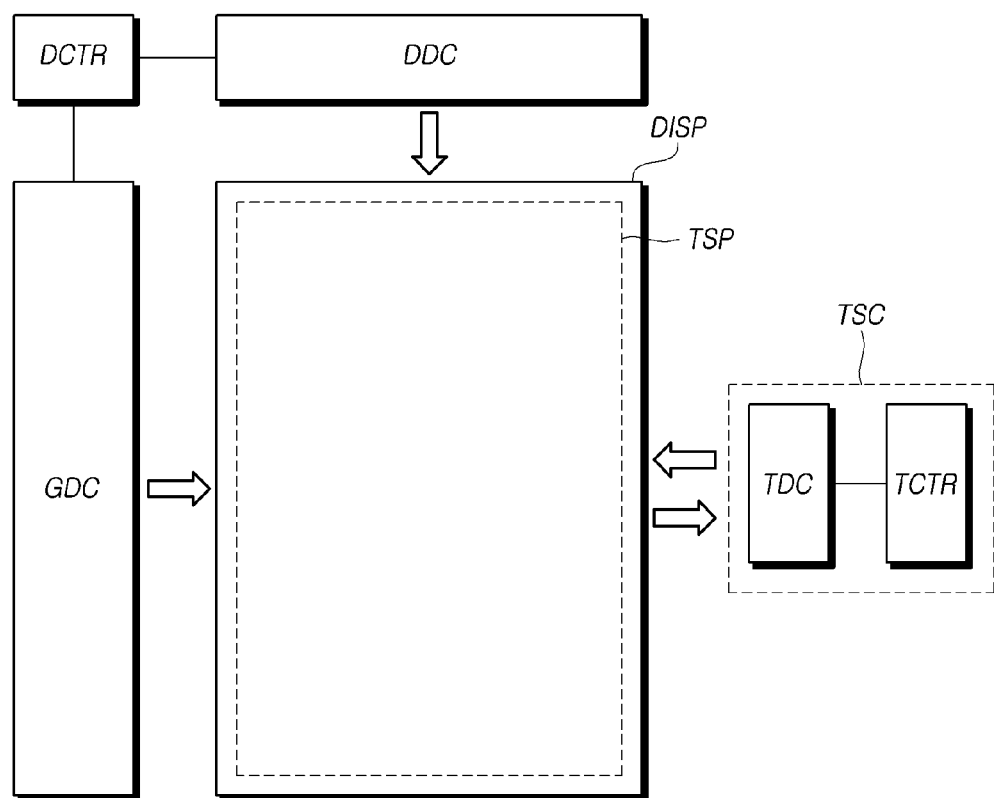
FIG. 1 is a diagram illustrating a system configuration of a touch display device according to embodiments of the present disclosure.

In the following description of examples or embodiments of the present disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present disclosure, detailed descriptions of well-known functions and components incorporated herein will be omitted when it is determined that the description may make the subject matter in some embodiments of the present disclosure rather unclear. The terms such as "including," "having," "containing," "constituting" "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements, etc., but is used merely to distinguish the corresponding element from other elements.

When it is mentioned that a first element "is connected or coupled to," "contacts or overlaps," etc., a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

FIG. 1 is a diagram illustrating a system configuration of a touch display device according to embodiments.

Referring to FIG. 1, the touch display device according to embodiments of the present disclosure can provide both an image display function and a touch-sensing function.

To provide the image display function, the touch display device according to embodiments of the present disclosure can comprise: a display panel DISP in which a plurality of data lines and a plurality of gate lines are disposed and a plurality of subpixels defined by the plurality of data lines and the plurality of gate lines are arrayed; a data driver (or data driver circuit) DDC driving the plurality of data lines; a gate driver (or gate driver circuit) GDC driving the plurality of gate lines; a display controller DCTR controlling the data driver DDC and gate driver GDC, and the like.

Each of the data driver DDC, the gate driver GDC, and the display controller DCTR can be implemented as one or more separate components. In some cases, two or more of the data driver DDC, the gate driver GDC, and the display controller DCTR can be integrated into a single component. For example, the data driver DDC and the display controller DCTR can be implemented as a single integrated circuit (IC) chip.

To provide the touch-sensing function, the touch display device according to embodiments of the present disclosure can comprise: a touch panel TSP including a plurality of touch electrodes; and a touch-sensing circuit TSC supplying a touch driving signal to the touch panel TSP, detecting a touch-sensing signal from the touch panel TSP, and detecting a touch of a user or determining a touch position (touch coordinates) on the touch panel TSP on the basis of a detected touch-sensing signal.

For example, the touch-sensing circuit TSC can comprise: a touch driving circuit TDC supplying a touch driving signal to the touch panel TSP and detecting a touch-sensing signal from the touch panel TSP; a touch controller TCTR determining at least one of the touch of the user and the touch coordinates on the basis of the touch-sensing signal detected by the touch driving circuit TDC, and the like.

The touch driving circuit TDC can comprise a first circuit part supplying the touch driving signal to the touch panel TSP and a second circuit part detecting the touch-sensing signal from the touch panel TSP.

The touch driving circuit TDC and the touch controller TCTR can be provided as separate components or, in some cases, can be integrated into a single component.

In addition, each of the data driver DDC, the gate driver GDC, and the touch driving circuit TDC is implemented as one or more ICs, and in terms of electrical connection to the display panel DISP, can have a chip-on-glass (COG) structure, a chip-on-film (COF) structure, a tape carrier package (TCP) structure, or the like. In addition, the gate driver GDC can have a gate-in-panel (GIP) structure.

In addition, each of the circuit configurations DDC, GDC, and DCTR for display driving and the circuit configurations TDC and TCTR for touch sensing can be implemented as one or more separate components. In some cases, one or more of the display driving circuit configurations DDC, GDC, and DCTR and one or more of the touch-sensing circuit configurations TDC and TCTR can be functionally integrated into one or more components.

For example, the data driver DDC and the touch driving circuit TDC can be integrated into one or more IC chips. In a case in which the data driver DDC and the touch driving circuit TDC are integrated into two or more IC chips, each of the two or more IC chips can have both a data driving function and a touch driving function.

In addition, the touch display device according to embodiments of the present disclosure can be various types of devices, such as an organic light-emitting diode (OLED) display device and a liquid crystal display (LCD) device. Hereinafter, the touch display device will be described as an OLED display device for the sake of brevity. That is, although the display panel DISP can be various types of devices, such as an OLED and an LCD, the display panel DISP will be described as an OLED panel as an example for the sake of brevity.

In addition, as will be described later, the touch panel TSP can comprise a plurality of touch electrodes to which the touch driving signal is applicable or from which the touch-sensing signal is detectable; a plurality of touch routing lines connecting the plurality of touch electrodes to the touch driving circuit TDC; and the like.

The touch panel TSP can be located outside of the display panel DISP. That is, the touch panel TSP and the display panel DISP can be fabricated separately and combined thereafter. Such a touch panel TSP is referred to as an add-on touch panel.

Alternatively, the touch panel TSP can be disposed inside of the display panel DISP. That is, when the display panel DISP is fabricated, touch sensor structures of the touch panel TSP, including the plurality of touch electrodes, the plurality of touch routing lines, and the like, can be provided together with electrodes and signal lines used for the display driving. Such a touch panel TSP is referred to as an in-cell touch panel. Hereinafter, for the sake of brevity, the touch panel TSP will be described as an in-cell touch panel TSP as an example.

Figure 2:
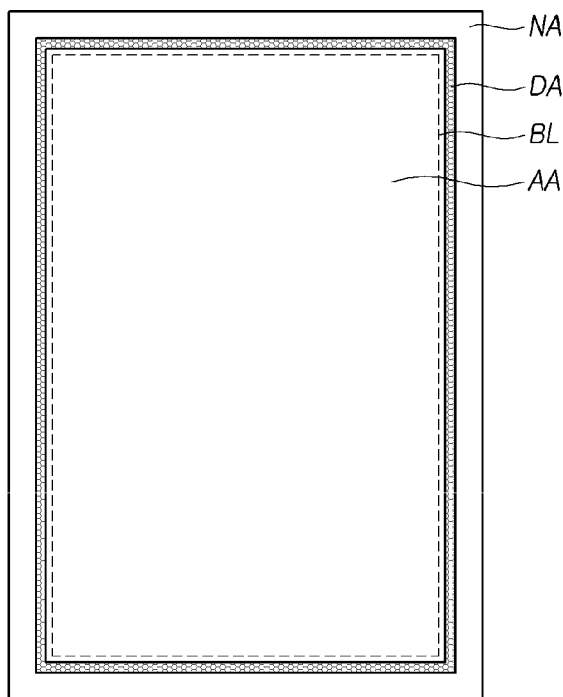
FIG. 2 is a diagram schematically illustrating a display panel of a touch display device according to embodiments of the present disclosure.

FIG. 2 is a diagram schematically illustrating the display panel DISP of the touch display device according to embodiments of the present disclosure.

Referring to FIG. 2, the display panel DISP can comprise an active area AA on which images are displayed and a non-active area NA located outside of an outer boundary line BL of the active area AA.

In the active area AA of the display panel DISP, a plurality of subpixels for displaying images are arranged, and a variety of electrodes and signal lines for the display driving area are disposed.

In addition, the plurality of touch electrodes for the touch sensing, the plurality of touch routing lines electrically connected to the plurality of touch electrodes, and the like can be disposed in the active area AA of the display panel DISP. Accordingly, the active area AA can also be referred to as a touch-sensing area in which the touch sensing can be performed.

In the non-active area NA of the display panel DISP, link lines produced by extending a variety of signal lines disposed in the active area AA or link lines electrically connected to the variety of signal lines disposed in the active area AA and pads electrically connected to the link lines can be disposed. The pads disposed in the non-active area NA can be bonded or electrically connected to the display driving circuits, such as DDC and GDC.

In addition, in the non-active area NA of the display panel DISP, link lines produced by extending a plurality of touch routing lines disposed in the active area AA or link lines electrically connected to the plurality of touch routing lines disposed in the active area AA and pads electrically connected to the link lines can be disposed. The pads disposed in the non-active area NA can be bonded or electrically connected to the touch driving circuit TDC.

In the non-active area NA, portions produced by expanding portions of the outermost touch electrodes among the plurality of touch electrodes disposed in the active area AA can be provided, and one or more electrodes (e.g., touch electrodes) made of the same material as the plurality of touch electrodes disposed in the active area AA can be further disposed.

That is, the entirety of the plurality of touch electrodes disposed in the display panel DISP can be located in the active area AA, specific touch electrodes (e.g., the outermost touch electrodes) among the plurality of touch electrodes disposed in the display panel DISP can be located in the non-active area NA, or specific touch electrodes (e.g., the outermost touch electrodes) among the plurality of touch electrodes disposed in the display panel DISP can extend across at least a portion of the active area AA and at least a portion of the non-active area NA.

In addition, referring to FIG. 2, the display panel DISP of the touch display device according to embodiments of the present disclosure can comprise a dam area DA in which a dam DAM (see FIG. 9) is disposed, the dam DAM serving to prevent a layer (e.g., an encapsulation layer in the OLED display panel) in the active area AA from collapsing.

The dam area DA can be located at the boundary between the active area AA and the non-active area NA, in a location of the non-active area NA at the periphery of the active area AA, or the like.

The dam disposed in the dam area DA can be disposed to surround the active area AA in all directions or only at the periphery of one or more portions (e.g., portions in which a fragile layer is located) of the active area AA.

The dams disposed in the dam area DA can be connected to be made as a single pattern or to be made as two or more separate patterns. In addition, in the dam area DA, only a first dam can be disposed, or two dams (e.g., a first dam and a second dam) can be disposed, or three or more dams can be disposed.

In the dam area DA, the first dam can only be provided in one direction, and both the first dam and the second dam can be provided in the other direction.

Figure 3:
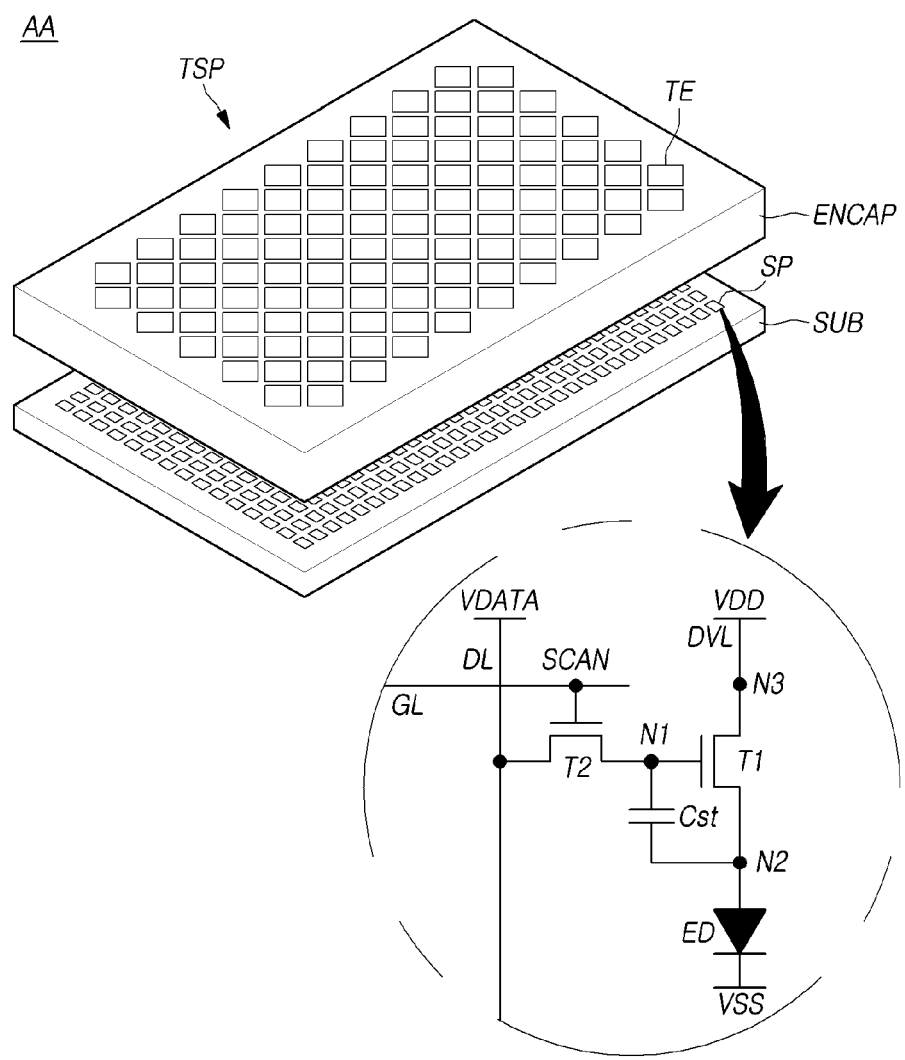
FIG. 3 is a diagram illustrating a structure in which a touch panel is disposed as an in-cell structure in a display panel according to embodiments of the present disclosure.

FIG. 3 is a diagram illustrating a structure in which the touch panel TSP is disposed as an in-cell structure in the display panel DISP according to embodiments of the present disclosure.

Referring to FIG. 3, a plurality of subpixels SP are arrayed on a substrate SUB in the active area AA of the display panel DISP.

Each of the subpixels SP can comprise an emitting device ED, a first transistor T1 driving the emitting device ED, a second transistor T2 delivering a data voltage VDATA to a first node N1 of the first transistor T1, a storage capacitor Cst maintaining a selected (or predetermined) voltage for a single frame, and the like.

The first transistor T1 can comprise the first node N1 to which the data voltage VDATA is applicable, a second node N2 electrically connected to the emitting device ED, and a third node N3 to which a driving voltage VDD is applied from a driving voltage line DVL. The first node N1 can be a gate node, the second node N2 can be a source node or a drain node, and the third node N3 can be a drain node or a source node. Such a first transistor T1 is also referred to as a driving transistor driving the emitting device ED.

The emitting device ED can comprise a first electrode (e.g., an anode), an emissive layer, and a second electrode (e.g., a cathode). The first electrode can be electrically connected to the second node N2 of the first transistor T1, and the second electrode can have a base voltage VSS applied thereto.

The emissive layer of the emitting device ED can be an organic emissive layer containing an organic material. In this case, the emitting device ED can be an organic light-emitting diode (OLED).

The second transistor T2 can be on/off controlled by a scan signal SCAN applied through a gate line GL and be electrically connected to the first node N1 of the first transistor T1 and a data line DL. Such a second transistor T2 is also referred to as a switching transistor.

When the second transistor T2 is turned on by the scan signal SCAN, the second transistor T2 delivers the data voltage VDATA supplied through the data line DL to the first node N1 of the first transistor T1.

The storage capacitor Cst can be electrically connected to the first node N1 and the second node N2 of the first transistor T1.

As illustrated in FIG. 3, each of the subpixels SP can have a 2T1C structure comprised of two transistors T1 and T2 and a single capacitor Cst. In some cases, each of the subpixels SP can further comprise one or more transistors or one or more capacitors.

The storage capacitor Cst can be an external capacitor intentionally designed to be disposed externally of the first transistor T1, rather than a parasitic capacitor (e.g., Cgs or Cgd), e.g., an internal capacitor present between the first node N1 and the second node N2 of the first transistor T1.

Each of the first transistor T1 and the second transistor T2 can be an n-type transistor or a p-type transistor.

As described above, circuit components, including the emitting device ED, two or more transistors T1 and T2, and one or more capacitor Cst, are disposed in the display panel DISP. Since such circuit components (in particular, the emitting device ED) are vulnerable to external moisture, oxygen, or the like, an encapsulation layer ENCAP preventing external moisture or oxygen from penetrating the circuit components (in particular, the emitting device ED) can be disposed in the display panel DISP.

Such an encapsulation layer ENCAP can be a single layer or have a multilayer structure.

In addition, in the touch display device according to embodiments of the present disclosure, the touch panel TSP can be disposed on the encapsulation layer ENCAP.

That is, in the touch display device, a touch sensor structure, including the plurality of touch electrodes TE, of the touch panel TSP can be disposed on the encapsulation layer ENCAP.

In the touch sensing, the touch driving signal can be applied to the touch electrodes TE, or the touch-sensing signal can be detected from the touch electrodes TE. Then, in the touch sensing, a potential difference can be produced between a touch electrode TE and a cathode disposed on both sides of the encapsulation layer ENCAP, thereby generating unnecessary parasitic capacitance. Since such parasitic capacitance can reduce touch sensitivity, the distance between the touch electrode TE and the cathode can be designed to be a selected (or predetermined) value (e.g., 1 μm) or more in consideration of the thickness of the panel, a panel fabrication process, display performance, and the like in order to reduce the parasitic capacitance. In this regard, for example, the thickness of the encapsulation layer ENCAP can be designed to be 1 μm or more.

Figure 4:
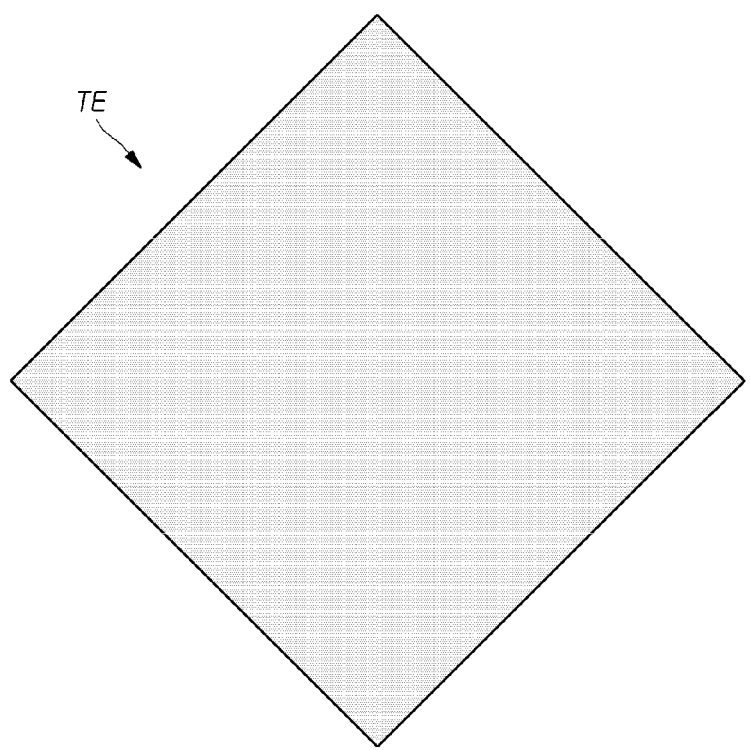
FIGS. 4 and 5 are diagrams illustrating types of touch electrodes disposed in a display panel according to embodiments of the present disclosure.
Figure 5:
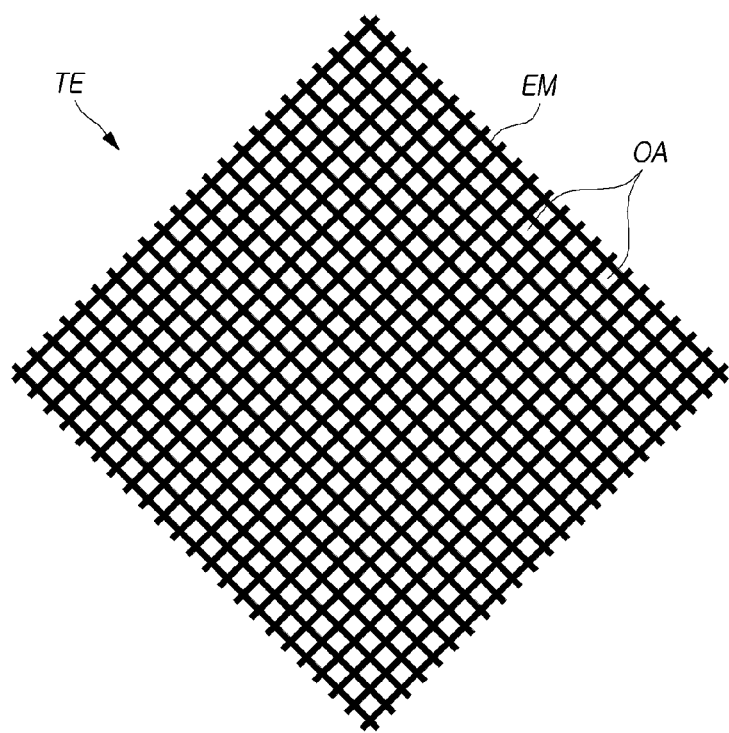

FIGS. 4 and 5 are diagrams illustrating types of touch electrodes TE disposed in the display panel DISP according to embodiments of the present disclosure.

As illustrated in FIG. 4, each of the touch electrodes TE disposed in the display panel DISP can be a plate-shaped electrode metal without an open area. In this case, each of the touch electrodes TE can be a transparent electrode. That is, each of the touch electrodes TE can be made of a transparent electrode material such that light emitted by the plurality of subpixels SP disposed below the touch electrodes TE can pass through the touch electrodes TE.

Alternatively, as illustrated in FIG. 5, each of the touch electrodes TE disposed in the display panel DISP can be an electrode metal EM in the shape of a patterned mesh having two or more open areas OA.

The electrode metal EM is a portion substantially corresponding to the touch electrode TE and is a portion to which the touch driving signal is applied or from which the touch-sensing signal is detected.

As illustrated in FIG. 5, in a case in which each of the touch electrodes TE is the electrode metal EM in the shape of a patterned mesh, two or more open areas OA can be present in the area of the touch electrode TE.

Each of the plurality of open areas OA provided in each of the touch electrodes TE can correspond to the emitting area of one or more subpixels SP. That is, the plurality of open areas OA are passages allowing light emitted from the plurality of subpixels SP located therebelow to pass upward therethrough. Hereinafter, for the sake of brevity, each of the touch electrodes TE will be described as a mesh-shaped electrode metal EM as an example.

The electrode metal EM corresponding to each of the touch electrodes TE can be located on a bank disposed in an area, except for the emitting area of two or more subpixels SP.

In addition, a method of fabricating a plurality of touch electrode TE can comprise making a mesh-shaped electrode metal EM having a wider area and then cutting the electrode metal EM to be made as a selected (or predetermined)

pattern such that portions of the electrode metal EM are electrically separated from each other, thereby fabricating a plurality of touch electrodes TE.

The outline of the touch electrode TE can have a rectangular shape, such as a diamond or a rhombus shape, as illustrated in FIGS. 4 and 5, or a variety of other shapes, such as a triangle, a pentagon, or a hexagon.

Figure 6:
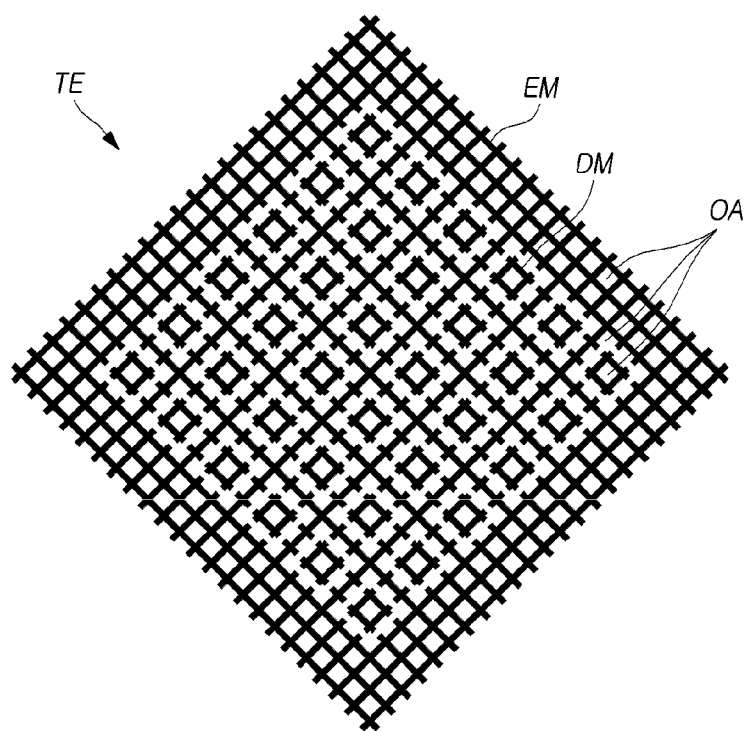
FIG. 6 is a diagram illustrating the mesh-shaped touch electrode illustrated in FIG. 5.

FIG. 6 is a diagram illustrating the mesh-shaped touch electrode TE illustrated in FIG. 5.

Referring to FIG. 6, in the area of each of the touch electrodes TE, one or more dummy metals DM disconnected from the mesh-shaped electrode metal EM can be provided.

The electrode metal EM is a portion substantially corresponding to the touch electrode TE and is a portion to which the touch driving signal is applied or from which the touch-sensing signal is detected. In contrast, the dummy metals DM are portions to which the touch driving signal is not applied and from which the touch-sensing signal is not detected, although the dummy metals DM are portions located in the area of the touch electrode TE. That is, the dummy metals DM can be electrically floating metals.

Thus, the electrode metal EM can be electrically connected to the touch driving circuit TDC, but none of the dummy metals DM are electrically connected to the touch driving circuit TDC.

In the area of each of the entire touch electrodes TE, one or more dummy metals DM can be provided while being disconnected from the electrode metals EM. Although FIG. 6 illustrates an example of a structure that the dummy metal DM is disposed on some area in an area of the touch electrode TE, the dummy metal DM can be present on whole area in the area of the touch electrode TE. Furthermore, the touch electrode TE can include the dummy metal DM or may not include the dummy metal DM, according to locations where the touch electrode TE is disposed.

For example, one or more dummy metal DM can be present to be separated from the electrode metal EM only in an area of each of some touch electrode TE of all touch electrodes TE. That is, the dummy metal DM may not be present in an area of some touch electrode TE.

The function of the dummy metals DM is related to a visibility issue. In a case in which only the mesh-shaped electrode metal EM is present in the area of the touch electrode TE without one or more dummy metals DM being present in the area of the touch electrode TE as illustrated in FIG. 5, the outline of the electrode metal EM can appear on the screen, thereby causing a visibility issue.

In contrast, in a case in which one or more dummy metals DM are present in the area of the touch electrode TE as illustrated in FIG. 6, the outline of the electrode metal EM appearing on the screen, e.g., the visibility issue, can be prevented.

In addition, touch sensitivity can be improved by adjusting the magnitude of capacitance according to each of the touch electrodes TE by adjusting the presence or absence or the number (or ratio) of the dummy metals DM of each of the touch electrodes TE.

In addition, specific points of the electrode metal EM provided in the area of a single touch electrode TE can be cut, so that the cut electrode metal EM form dummy metals DM. That is, the electrode metal EM and the dummy metals DM can be made of the same material provided on the same layer.

In addition, the touch display device according to embodiments of the present disclosure can detect a touch on the basis of capacitance generated on the touch electrode TE.

The touch display device according to embodiments of the present disclosure can detect a touch by a capacitance-based touch sensing method, more particularly, mutual capacitance-based touch sensing or self-capacitance-based touch sensing.

In the mutual capacitance-based touch sensing, the plurality of touch electrodes TE can be divided into driving touch electrodes (or transmitting touch electrodes) to which the touch driving signal is applied and sensing touch electrodes (or receiving touch electrodes) detecting the touch sensing signal and generating capacitance together with the driving touch electrodes.

In the mutual capacitance-based touch sensing, the touch-sensing circuit TSC detects a touch and determines touch coordinates on the basis of changes in the capacitance (e.g., mutual capacitance) occurring between the driving touch electrodes and the sensing touch electrodes, depending on the presence or absence of a pointer, such as a finger or a pen.

In the self-capacitance-based touch sensing, each of the touch electrodes TE serves as both a driving touch electrode and a sensing touch electrode. That is, the touch-sensing circuit TSC detects a touch and determines touch coordinates by applying the touch driving signal to one or more touch electrodes TE, detecting the touch-sensing signal through the touch electrode TE to which the touch driving signal is applied, and recognizing changes in the capacitance between the pointer, such as a finger or a pen, and the touch electrode TE, on the basis of the detected touch-sensing signal. Accordingly, in the self-capacitance-based touch sensing, there is no difference between the driving touch electrodes and the sensing touch electrodes.

As described above, the touch display device according to embodiments of the present disclosure can perform the touch sensing by the mutual capacitance-based touch sensing or the self-capacitance-based touch sensing. Hereinafter, for the sake of brevity, the touch display device performing the mutual capacitance-based touch sensing and having a touch sensor structure for the mutual capacitance-based touch sensing will be described as an example.

Figure 7:
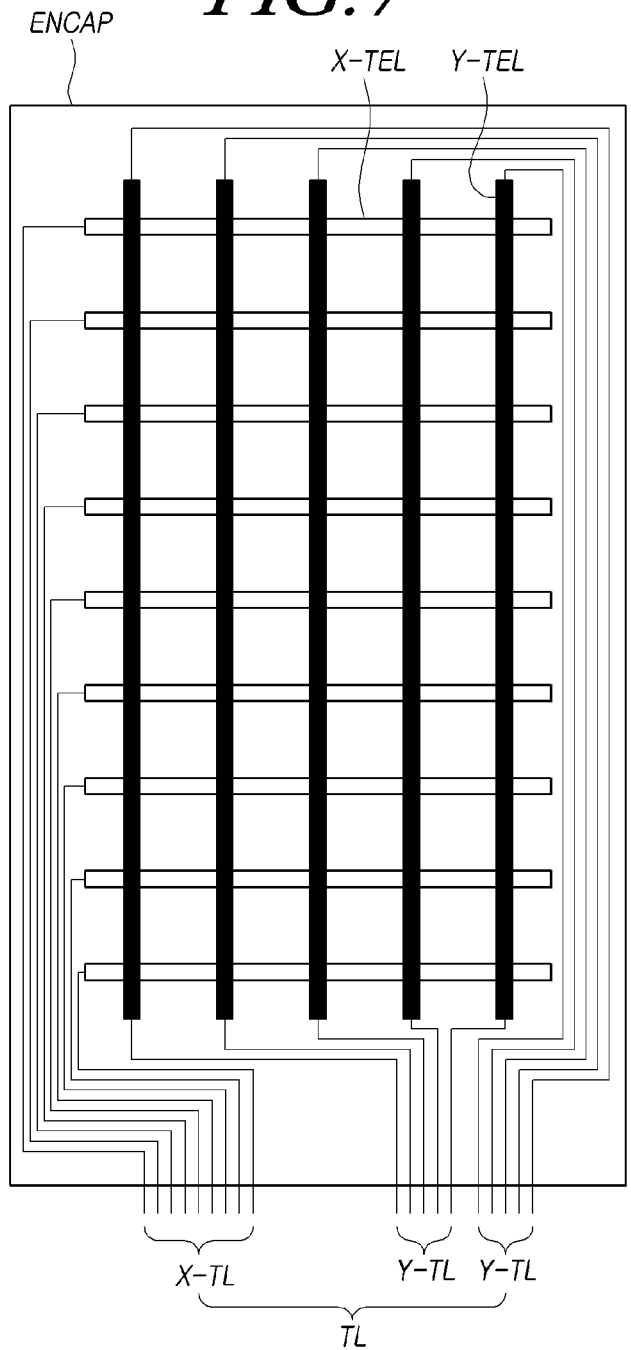
FIG. 7 is a diagram schematically illustrating a touch sensor structure in a display panel according to embodiments of the present disclosure.
Figure 8:
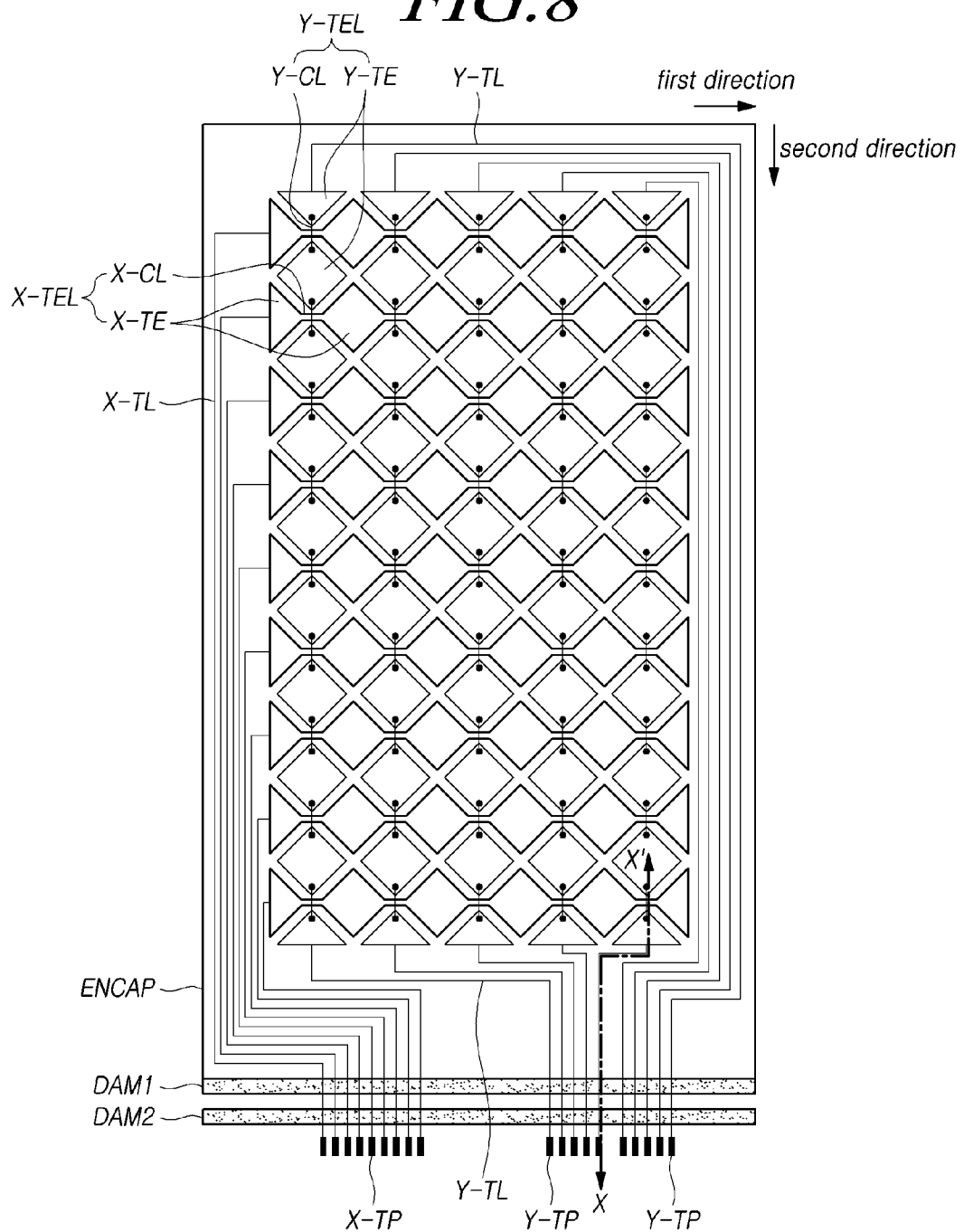
FIG. 8 is a diagram illustrating an example of the touch sensor structure illustrated in FIG. 7.

FIG. 7 is a diagram schematically illustrating a touch sensor structure in the display panel DISP according to embodiments of the present disclosure, and FIG. 8 is a diagram illustrating an example of the touch sensor structure illustrated in FIG. 7.

Referring to FIG. 7, the touch sensor structure for the mutual capacitance-based touch sensing can comprise a plurality of X-touch electrode lines X-TEL and a plurality of Y-touch electrode lines Y-TEL. Here, the plurality of X-touch electrode lines X-TEL and the plurality of Y-touch electrode lines Y-TEL are located on the encapsulation layer ENCAP.

Each of the plurality of X-touch electrode lines X-TEL can be disposed in a first direction, and each of the plurality of Y-touch electrode lines Y-TEL can be disposed in a second direction different from the first direction.

Herein, the first direction and the second direction can be different directions. For example, the first direction can be the X-axis direction, while the second direction can be the Y-axis direction. Alternatively, the first direction can be the Y-axis direction, while the second direction can be the X-axis direction. In addition, the first direction and the second direction can or cannot intersect perpendicularly. In addition, the terms "column" and "row" as used herein are relative terms. The column and the row can be switched depending on the viewing perspective.

Each of the plurality of X-touch electrode lines X-TEL can be comprised of a plurality of X-touch electrodes X-TE electrically connected to each other. Each of the plurality of Y-touch electrode lines Y-TEL can be comprised of a plurality of Y-touch electrodes Y-TE electrically connected to each other.

Here, the plurality of X-touch electrodes X-TE and the plurality of Y-touch electrodes Y-TE are electrodes included in the plurality of touch electrodes TE, and have different functions.

For example, the plurality of X-touch electrodes X-TE constituting each of the plurality of X-touch electrode lines X-TEL can be the driving touch electrodes, while the plurality of Y-touch electrodes Y-TE constituting each of the plurality of Y-touch electrode lines Y-TEL can be the sensing touch electrodes. In this case, each of the plurality of X-touch electrode lines X-TEL corresponds to a driving touch electrode lines, and each of the plurality of Y-touch electrode lines Y-TEL corresponds to a sensing touch electrode line.

Alternatively, the plurality of X-touch electrodes X-TE constituting each of the plurality of X-touch electrode lines X-TEL can be the sensing touch electrodes, while the plurality of Y-touch electrodes Y-TE constituting each of the plurality of Y-touch electrode lines Y-TEL can be the driving touch electrodes. In this case, each of the plurality of X-touch electrode lines X-TEL corresponds to the sensing touch electrode line, and each of the plurality of Y-touch electrode lines Y-TEL corresponds to the driving touch electrode line.

A touch sensor metal TSM for the touch sensing can comprise a plurality of touch routing lines TL in addition to the plurality of X-touch electrode lines X-TEL and the plurality of Y-touch electrode lines Y-TEL.

The plurality of touch routing lines TL can comprise one or more X-touch routing lines X-TL connected to the plurality of X-touch electrode lines X-TEL, respectively, and one or more Y-touch routing lines Y-TL connected to the plurality of Y-touch electrode lines Y-TEL, respectively.

Referring to FIG. 8, each of the plurality of X-touch electrode lines X-TEL can comprise a plurality of X-touch electrodes X-TE disposed in the same row (or column) and one or more X-touch electrode connecting lines X-CL electrically connecting the plurality of X-touch electrodes X-TE. Here, the X-touch electrode connecting lines X-CL respectively connecting two adjacent X-touch electrodes X-TE can be metals integrated with the two adjacent X-touch electrodes X-TE (see FIG. 8) or metals connected to the two adjacent X-touch electrodes X-TE via contact holes.

Each of the plurality of Y-touch electrode lines Y-TEL can comprise a plurality of Y-touch electrodes Y-TE disposed in the same column (or row) and one or more Y-touch electrode connecting lines Y-CL electrically connecting the plurality of Y-touch electrodes Y-TE. Here, the Y-touch electrode connecting lines Y-CL respectively connecting two adjacent Y-touch electrodes Y-TE can be metals integrated with the two adjacent Y-touch electrodes Y-TE or metals connected to the two adjacent Y-touch electrodes Y-TE via contact holes (see FIG. 8).

In areas in which the X-touch electrode lines X-TEL intersect the Y-touch electrode lines Y-TEL (e.g., touch electrode line intersecting areas), the X-touch electrode connecting lines X-CL can intersect the Y-touch electrode connecting lines Y-CL.

In a case in which the X-touch electrode connecting lines X-CL intersect the Y-touch electrode connecting lines Y-CL in the touch electrode line intersecting areas as described above, the X-touch electrode connecting lines X-CL must be located on a layer different from that of the Y-touch electrode connecting lines Y-CL.

Accordingly, the plurality of X-touch electrodes X-TE, the plurality of X-touch electrode connecting lines X-CL, the plurality of Y-touch electrodes Y-TE, and the plurality of Y-touch electrode connecting lines Y-CL can be located on two or more layers, such that the plurality of X-touch electrode lines X-TEL intersect the plurality of Y-touch electrode lines Y-TEL.

Referring to FIG. 8, each of the plurality of X-touch electrode lines X-TEL is electrically connected to a corresponding X-touch pad X-TP through one or more X-touch routing lines X-TL. That is, the outermost X-touch electrode X-TE among the plurality of X-touch electrodes X-TE included in a single X-touch electrode line X-TEL is electrically connected to a corresponding X-touch pad X-TP via the X-touch routing line X-TL.

Each of the plurality of Y-touch electrode lines Y-TEL is electrically connected to corresponding Y-touch pads Y-TP through one or more Y-touch routing lines Y-TL. That is, the outermost Y-touch electrodes Y-TE among the plurality of Y-touch electrodes Y-TE included in a single Y-touch electrode line Y-TEL is electrically connected to the corresponding Y-touch pads Y-TP through the Y-touch routing lines Y-TL.

In addition, as illustrated in FIG. 8, the plurality of X-touch electrode lines X-TEL and the plurality of Y-touch electrode lines Y-TEL can be disposed on the encapsulation layer ENCAP. That is, the plurality of X-touch electrodes X-TE, constituting the plurality of X-touch electrode lines X-TEL, and the plurality of X-touch electrode connecting lines X-CL can be disposed on the encapsulation layer ENCAP. The plurality of Y-touch electrodes Y-TE, constituting the plurality of Y-touch electrode lines Y-TEL, and the plurality of Y-touch electrode connecting lines Y-CL can be disposed on the encapsulation layer ENCAP.

In addition, as illustrated in FIG. 8, the plurality of X-touch routing lines X-TL electrically connected to the plurality of X-touch electrode lines X-TEL can be disposed on the encapsulation layer ENCAP and extend to a location in which the encapsulation layer ENCAP is not provided, thereby being electrically connected to a plurality of X-touch pads X-TP, respectively. The plurality of Y-touch routing lines Y-TL electrically connected to the plurality of Y-touch electrode lines Y-TEL can be disposed on the encapsulation layer ENCAP and extend to a location in which encapsulation layer ENCAP is not provided, thereby being electrically connected to a plurality of Y-touch pads Y-TP, respectively. Here, the encapsulation layer ENCAP can be located in the active area AA and, in some cases, can expand to the non-active area NA.

In addition, as described above, a dam area DA can be provided at the boundary between the active area AA and the non-active area NA or in the non-active area NA at the periphery of the active area AA in order to prevent a layer (e.g., an encapsulation in the OLED display panel) in the active area AA from collapsing.

As illustrated in FIG. 8, for example, a first dam DAM1 and a second dam DAM2 can be disposed in the dam area DA. Here, the second dam DAM2 can be located more outward than the first dam DAM1.

In a manner different from that illustrated in FIG. 8, only the first dam DAM1 can be located in the dam area DA. In some cases, not only the first dam DAM1 and the second dam DAM2 but also one or more additional dam can be disposed in the dam area DA.

Referring to FIG. 8, the encapsulation layer ENCAP can be located on a side of the first dam DAM1 or be located both on a side of and above the first dam DAM1.

Figure 9:
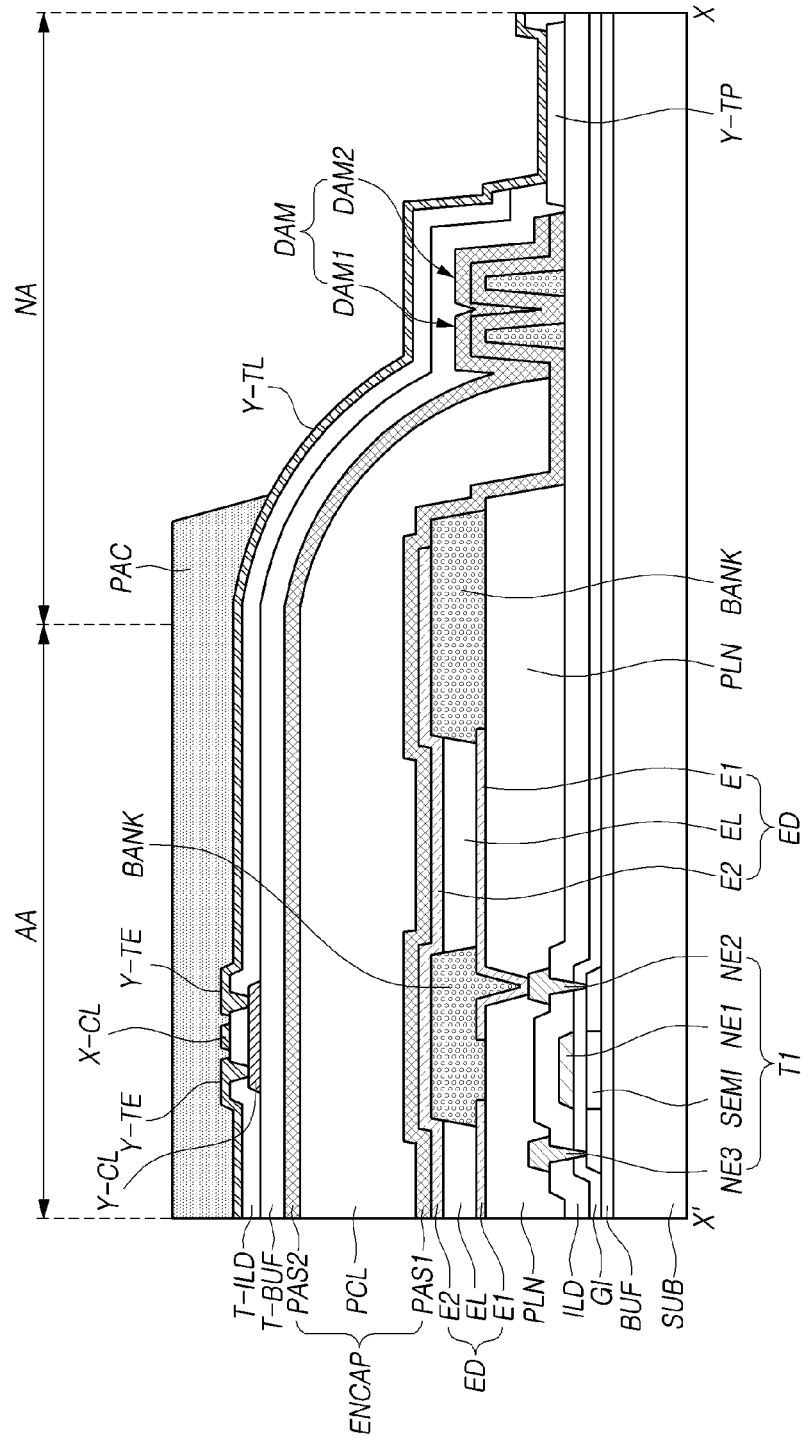
FIG. 9 is a cross-sectional diagram illustrating portions of the display panel according to embodiments of the present disclosure, taken along line X-X' in FIG. 8.

FIG. 9 is a cross-sectional diagram illustrating portions of the display panel DISP according to embodiments of the present disclosure, taken along line X-X' in FIG. 8. In FIG. 9, the touch electrode TE is illustrated in the shape of a plate. However, this is illustrative only, and the touch electrode TE can be mesh shaped. In a case in which the touch electrode TE is mesh shaped, the open areas OA of the touch electrode TE can be located above the emissive areas of subpixels SP.

The first transistor T1, e.g., the driving transistor in each of the subpixels SP in the active area AA, is disposed on the substrate SUB.

The first transistor T1 comprises a first node electrode NE1 corresponding to the gate electrode, a second node electrode NE2 corresponding to a source electrode or a drain electrode, a third node electrode NE3 corresponding to a drain electrode or a source electrode, a semiconductor layer SEMI, and the like.

The first node electrode NE1 and the semiconductor layer SEMI can be located on both sides of a gate insulating film GI to overlap each other. The second node electrode NE2 can be provided on an interlayer insulating film ILD to be in contact with one side of the semiconductor layer SEMI, while the third node electrode NE3 can be provided on the interlayer insulating film ILD to be in contact with the other side of the semiconductor layer SEMI.

The emitting device ED can comprise a first electrode E1 corresponding to an anode (or cathode), an emitting layer EL provided on the first electrode E1, a second electrode E2 corresponding to a cathode (or anode) provided on the emitting layer EL, and the like.

The first electrode E1 is electrically connected to the second node electrode NE2 of the first transistor T1, exposed through a pixel contact hole extending through a planarization layer PLN.

The emitting layer EL is provided on the first electrode E1 in the emitting area provided by banks BANK. The emitting layer EL is provided on the first electrode E1 and is comprised of a hole-related layer, an emissive layer, and an electron-related layer stacked in the stated order or inversely. The second electrode E2 is provided on the side of the emitting layer EL opposite to the first electrode E1.

The encapsulation layer ENCAP prevents external moisture or oxygen from penetrating the emitting device ED vulnerable to external moisture, oxygen, or the like.

The encapsulation layer ENCAP can be a single layer or, as illustrated in FIG. 9, be comprised of a plurality of layers PAS1, PCL, and PAS2.

For example, in a case in which the encapsulation layer ENCAP is comprised of the plurality of layers PAS1, PCL, and PAS2, the encapsulation layer ENCAP can comprise one or more inorganic encapsulation layers PAS1 and PAS2 and one or more organic encapsulation layers PCL. As a specific example, the encapsulation layer ENCAP can have a structure in which the first inorganic encapsulation layer PAS1, the organic encapsulation layer PCL, and the second inorganic encapsulation layer PAS2 are stacked in order.

Here, the organic encapsulation layer PCL can further comprise at least one organic encapsulation layer or at least one inorganic encapsulation layer.

The first inorganic encapsulation layer PAS1 is provided on the substrate SUB, on which the second electrode E2 corresponding to the cathode is provided, so as to be closest to the emitting device ED. The first inorganic encapsulation layer PAS1 is made of an inorganic insulating material, such as silicon nitride (SiNx), silicon oxide (SiOx), silicon oxynitride (SiON), or aluminum oxide ($Al_2O_3$), which can be deposited at a low temperature. Since the first inorganic encapsulation layer PAS1 is deposited in a low-temperature atmosphere, the first inorganic encapsulation layer PAS1 can prevent the emitting layer EL containing an organic material vulnerable to a high-temperature atmosphere from being damaged during deposition processing.

The organic encapsulation layer PCL can be provided in an area smaller than the area of the first inorganic encapsulation layer PAS1. In this case, the organic encapsulation layer PCL can be configured to expose both edges of the first inorganic encapsulation layer PAS1. The organic encapsulation layer PCL can serve as a buffer to reduce stress between the layers caused by bending of the touch display device and serve to enhance planarization performance. The organic encapsulation layer PCL can be made of, for example, an organic insulating material, such as an acrylic resin, an epoxy resin, polyimide, polyethylene, silicon oxycarbon (SiOC).

In addition, in a case in which the organic encapsulation layer PCL is fabricated by inkjet printing, one or more dams DAM can be provided in the dam area DA corresponding to the boundary between the non-active area NA and the active area AA or a portion of the non-active area NA.

For example, as illustrated in FIG. 9, the dam area DA is located between a pad area in the non-active area NA and the active area AA. The pad area refers to a portion of the non-active area NA in which the plurality of X-touch pads X-TP and the plurality of Y-touch pads Y-TP are provided. In the dam area DA, the first dam DAM1 adjacent to the active area AA and the second dam DAM2 adjacent to the pad area can be provided.

The one or more dams DAM disposed in the dam area DA can prevent the organic encapsulation layer PCL in a liquid form from collapsing in the direction of the non-active area NA and penetrating into the pad area when the organic encapsulation layer PCL in the liquid form is dropped to the active area AA.

This effect can be further increased by the provision of the first dam DAM1 and the second dam DAM2 as illustrated in FIG. 9.

At least one of the first dam DAM1 and the second dam DAM2 can have a single layer or multilayer structure. For example, at least one of the first dam DAM1 and the second dam DAM2 can be simultaneously made of the same material as at least one of the banks BANK and spacers (not shown). In this case, a dam structure can be provided without additional mask processing or an increase in cost.

In addition, as illustrated in FIG. 9, at least one of the first dam DAM1 and the second dam DAM2 can have a structure in which at least one of the first inorganic encapsulation layer PAS1 and the second inorganic encapsulation layer PAS2 is stacked on the banks BANK.

In addition, the organic encapsulation layer PCL containing an organic material can be located on an inner side of the first dam DAM1, as illustrated in FIG. 9.

Alternatively, the organic encapsulation layer PCL containing an organic material can be located above at least a portion of the first dam DAM1 and the second dam DAM2. For example, the organic encapsulation layer PCL can be located above the first dam DAM1.

The second inorganic encapsulation layer PAS2 can be provided on the substrate SUB on which the organic encapsulation layer PCL is provided, so as to cover the top surfaces and side surfaces of the organic encapsulation layer PCL and the first inorganic encapsulation layer PAS1. The second inorganic encapsulation layer PAS2 reduces or minimizes or prevents external moisture or oxygen from penetrating the first inorganic encapsulation layer PAS1 or the organic encapsulation layer PCL. The second inorganic encapsulation layer PAS2 is made of, for example, an inorganic insulating material, such as SiNx, SiOx, SiON, or $Al_2O_3$.

A touch buffer film T-BUF can be provided on the encapsulation layer ENCAP. The touch buffer film T-BUF can be located between the touch sensor metal TSM, including the X and Y-touch electrodes X-TE and Y-TE and X and Y-touch electrode connecting lines X-CL and Y-CL, and the second electrode E2 of the emitting device ED.

The touch buffer film T-BUF can be designed to maintain a selected (or predetermined) minimum distance (e.g., 1 μm) or more between the touch sensor metal TSM and the second electrode E2 of the emitting device ED. Accordingly, this can reduce or prevent parasitic capacitance generated between the touch sensor metal TSM and the second electrode E2 of the emitting device ED, thereby preventing touch sensitivity from being reduced by the parasitic capacitance.

Without the touch buffer film T-BUF, the touch sensor metal TSM comprising the X and Y-touch electrodes X-TE and Y-TE and the X and Y-touch electrode connecting lines X-CL and Y-CL can be disposed on the encapsulation layer ENCAP.

In addition, the touch buffer film T-BUF can prevent the emitting layer EL containing the organic material from being penetrated by a chemical agent (e.g., a developing solution or an etching solution) used in fabrication processing of the touch sensor metal TSM disposed on the touch buffer film T-BUF, external moisture, or the like. Accordingly, the touch buffer film T-BUF can prevent the emitting layer EL vulnerable to the chemical agent or moisture from being damaged.

The touch buffer film T-BUF is made of an organic insulating material producible at a low temperature equal to or lower than a selected (or predetermined) temperature (e.g., 100° C.) and having a low dielectric constant of 1 to 3 in order to prevent the emitting layer EL containing the organic material vulnerable to high temperature from being damaged. For example, the touch buffer film T-BUF can be made of an epoxy-based material or a siloxane-based material. The touch buffer film T-BUF made of an inorganic insulating material and having a planarization performance can prevent the layers PAS1, PCL, and PAS2 included in the encapsulation layer ENCAP from being damaged or the touch sensor metal TSM on the touch buffer film T-BUF from being fractured in response to the bending of the OLED display device.

According to the mutual capacitance-based touch sensor structure, the X-touch electrode lines X-TEL and the Y-touch electrode lines Y-TEL are disposed on the touch buffer film T-BUF, and the X-touch electrode lines X-TEL and the Y-touch electrode lines Y-TEL can be disposed such that the X-touch electrode lines X-TEL intersect the Y-touch electrode lines Y-TEL.

The Y-touch electrode lines Y-TEL can comprise the plurality of Y-touch electrodes Y-TE and the plurality of Y-touch electrode connecting lines Y-CL electrically connecting the plurality of Y-touch electrodes Y-TE.

As illustrated in FIG. 9, the plurality of Y-touch electrodes Y-TE and the plurality of Y-touch electrode connecting lines Y-CL can be disposed on different layers, on both sides of a touch insulating film T-ILD.

The plurality of Y-touch electrodes Y-TE can be spaced apart from each other by selected (or predetermined) distances in the Y-axis direction. Each of the plurality of Y-touch electrodes Y-TE can be electrically connected to the other adjacent Y-touch electrodes Y-TE through the Y-touch electrode connecting lines Y-CL in the Y-axis direction.

The Y-touch electrode connecting lines Y-CL can be provided on the touch buffer film T-BUF and exposed through touch contact holes extending through the touch insulating film T-ILD to be electrically connected to the two adjacent Y-touch electrodes Y-TE in the Y-axis direction.

The Y-touch electrode connecting lines Y-CL can be disposed to overlap the banks BANK. Accordingly, the aperture ratio can be prevented from being decreased by the Y-touch electrode connecting lines Y-CL.

The X-touch electrode lines X-TEL can comprise the plurality of X-touch electrodes X-TE and the plurality of X-touch electrode connecting lines X-CL electrically connecting the plurality of X-touch electrodes X-TE. The plurality of X-touch electrodes X-TE and the plurality of X-touch electrode connecting line X-CL can be disposed on different layers, on both sides of the touch insulating film T-ILD.

The plurality of X-touch electrodes X-TE can be disposed on the touch insulating film T-ILD, spaced apart from each other by selected (or predetermined) distances in the X-axis direction. Each of the plurality of X-touch electrodes X-TE can be electrically connected to the adjacent other X-touch electrodes X-TE through the X-touch electrode connecting lines X-CL in the X-axis direction.

The X-touch electrode connecting lines X-CL can be disposed on the same plane as the X-touch electrodes X-TE to be electrically connected to the two adjacent X-touch electrodes X-TE in the X-axis direction without separate contact holes or be integrated with the two adjacent X-touch electrodes X-TE in the X-axis direction.

The X-touch electrode connecting lines X-CL can be disposed to overlap the banks BANK. Accordingly, the aperture ratio can be prevented from being decreased by the X-touch electrode connecting lines X-CL.

In addition, the Y-touch electrode lines Y-TEL can be electrically connected to the touch driving circuit TDC through the Y-touch routing lines Y-TL and the Y-touch pads Y-TP. In the same manner, the X-touch electrode lines X-TEL can be electrically connected to the touch driving circuit TDC through the X-touch routing lines X-TL and the X-touch pads X-TP.

A pad cover electrode covering the X-touch pads X-TP and the Y-touch pads Y-TP can be further disposed.

The X-touch pads X-TP can be provided separately from the X-touch routing lines X-TL or be provided as extensions of the X-touch routing lines X-TL. The Y-touch pads Y-TP can be provided separately from the Y-touch routing lines Y-TL or be provided as extensions of the Y-touch routing lines Y-TL.

In a case in which the X-touch pads X-TP are extensions of the X-touch routing lines X-TL and the Y-touch pads Y-TP are extensions of the Y-touch routing lines Y-TL, the X-touch pads X-TP, the X-touch routing lines X-TL, the Y-touch pads Y-TP, and the Y-touch routing lines Y-TL can be comprised of the same material, e.g., a first conductive material. The first conductive material can have a single or multilayer structure made of a metal, such as Al, Ti, Cu, or Mo, having high corrosion resistance, high acid resistance, and high conductivity.

For example, each of the X-touch pads X-TP, the X-touch routing lines X-TL, the Y-touch pads Y-TP, and the Y-touch routing lines Y-TL comprised of the first conductive material can have a three-layer structure, such as Ti/Al/Ti or Mo/Al/Mo.

The pad cover electrode capable of covering the X-touch pads X-TP and the Y-touch pads Y-TP can be comprised of the same material as the X and Y-touch electrodes X-TE and Y-TE, e.g., a second conductive material. The second conductive material can be a transparent conductive material, such as indium tin oxide (ITO) or indium zinc oxide (IZO), having high corrosion resistance and acid resistance. The pad cover electrodes can be provided to be exposed from the touch buffer film T-BUF so as to be bonded to the touch driving circuit TDC or to a circuit film on which the touch driving circuit TDC is mounted.

The touch buffer film T-BUF can be provided to cover the touch sensor metal TSM so as to prevent the touch sensor metal TSM from being corroded by external moisture. For example, the touch buffer film T-BUF can be made of an organic insulating material or be provided as a circular polarizer or a film made of an epoxy or acrylic material. The touch buffer film T-BUF may not be provided on the encapsulation layer ENCAP. That is, the touch buffer film T-BUF may not be an essential component.

The Y-touch routing lines Y-TL can be electrically connected to the Y-touch electrodes Y-TE via touch routing line contact holes or be integrated with the Y-touch electrodes Y-TE.

Each of the Y-touch routing lines Y-TL can extend to the non-active area NA, past the top and side portions of the encapsulation layer ENCAP and the dams DAM, so as to be electrically connected to the Y-touch pads Y-TP. Accordingly, the Y-touch routing lines Y-TL can be electrically connected to the touch driving circuit TDC through the Y-touch pads Y-TP.

The Y-touch routing lines Y-TL can deliver the touch-sensing signal from the Y-touch electrodes Y-TE to the touch driving circuit TDC or deliver the touch driving signal, received from the touch driving circuit TDC, to the Y-touch electrodes Y-TE.

The X-touch routing lines X-TL can be electrically connected to the X-touch electrodes X-TE via the touch routing line contact holes or be integrated with the X-touch electrodes X-TE.

The X-touch routing lines X-TL can extend to the non-active area NA, past the top and side portions of the encapsulation layer ENCAP and the dams DAM, so as to be electrically connected to the X-touch pads Y-TP. Accordingly, the X-touch routing lines X-TL can be electrically connected to the touch driving circuit TDC through the X-touch pads X-TP.

The X-touch routing lines X-TL can deliver the touch driving signal, received from the touch driving circuit TDC, to the X-touch electrodes X-TE or deliver touch-sensing signal from the X-touch electrodes X-TE to the touch driving circuit TDC.

The arrangement of the X-touch routing lines X-TL and the Y-touch routing lines Y-TL can be modified variously depending on the design specification of the panel.

A touch protective film PAC can be disposed on the X-touch electrodes X-TE and the Y-touch electrodes Y-TE. The touch protective film PAC can extend to an area in front of or behind the dams DAM so as to be disposed on the X-touch routing lines X-TL and the Y-touch routing lines Y-TL.

The cross-sectional diagram of FIG. 9 is conceptual illustration of the structure. The positions, thicknesses, or widths of the patterns (e.g., various layers or electrodes) can vary depending on the direction or position of view, the structures for connecting the patterns can be modified, additional layers other than the plurality of illustrated layers can be further provided, and some of the plurality of illustrated layers can be omitted or integrated. For example, the width of the banks BANK can be narrower than that illustrated in the drawings, and the height of the dams DAM can be lower or higher than that illustrated in the drawings. In addition, the cross-sectional diagram of FIG. 9 illustrates a structure in which the touch electrode TE, the touch routing lines TL, and the like are disposed on the entirety of the subpixels SP in order to illustrate a structure connected to the touch pads TP along inclines of the touch routing lines TL and the encapsulation layer ENCAP. However, in a case in which the touch electrode TE or the like is mesh-shaped as described above, the open areas OA of the touch electrode TE can be located above the emitting areas of the subpixels SP. In addition, a color filter CF (see FIGS. 10 and 11) can be further disposed on the encapsulation layer ENCAP. The color filter CF can be located on the touch electrode TE or between the encapsulation layer ENCAP and the touch electrode TE.

Furthermore, in the case that the non-active area NA of the display panel DISP is bent, an area where the display panel DISP is bent can be present between the touch pad TP and the dam DAM. The touch pad TP can be located between the area where the display panel DISP is bent and an outer boundary of the display panel DISP on the non-active area NA of the display panel DISP.

Figure 10:
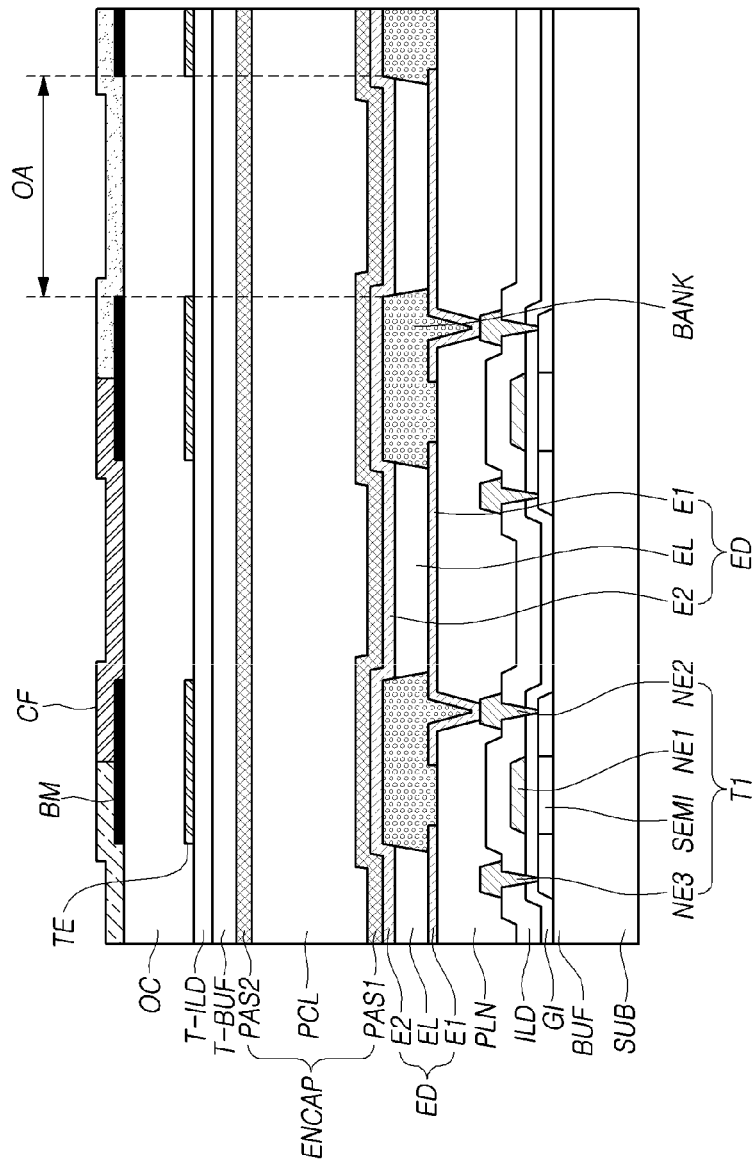
FIGS. 10 and 11 are diagrams illustrating a cross-sectional structure of a display panel according to embodiments of the present disclosure, including a color filter.
Figure 11:
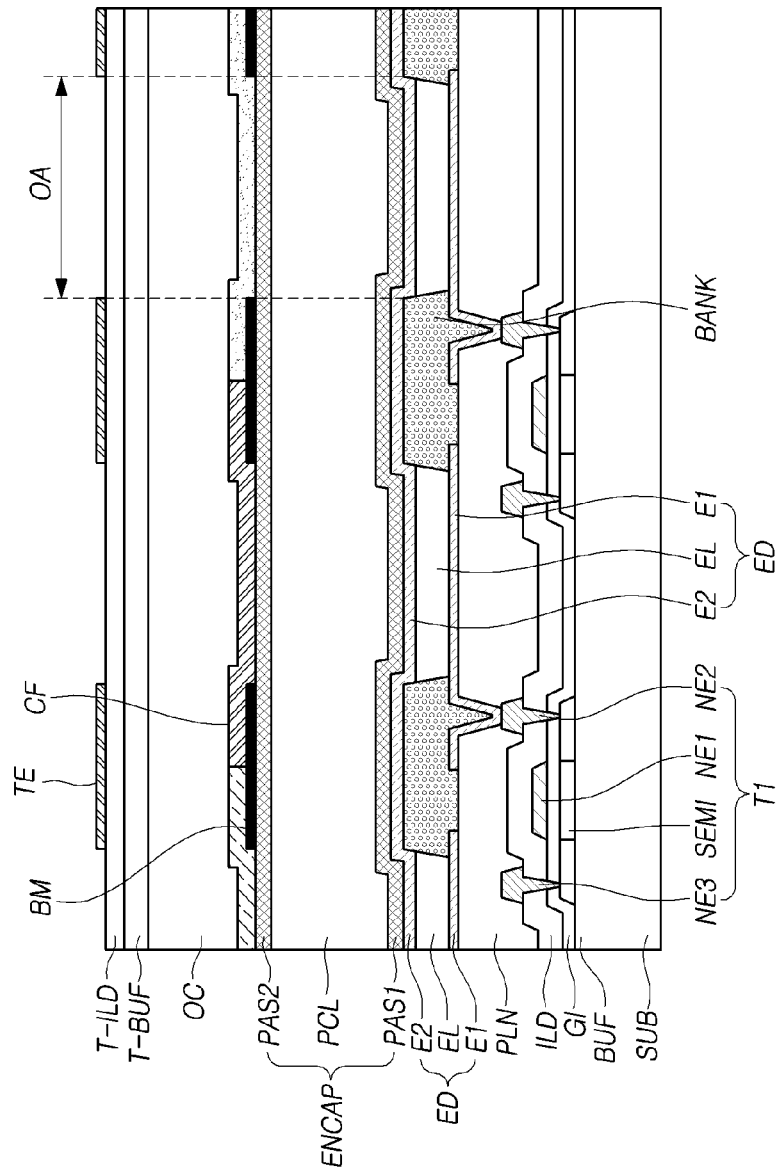

FIGS. 10 and 11 are diagrams illustrating a cross-sectional structure of the display panel DISP according to embodiments of the present disclosure, including the color filter CF.

Referring to FIGS. 10 and 11, in a case in which the touch panel TSP is disposed within the display panel DISP and the display panel DISP is provided as an OLED display panel, the touch panel TSP can be located on the encapsulation layer ENCAP in the display panel DISP. That is, the touch sensor metals TSM, such as the plurality of touch electrodes TE and the plurality of touch routing lines TL, can be located on the encapsulation layer ENCAP in the display panel DISP.

The touch electrode TE being provided on the encapsulation layer ENCAP as described above can be made as the touch electrode TE without significantly influencing the display performance or the formation of a display-related layer.

Referring to FIGS. 10 and 11, the second electrode E2 that can be the cathode of the OLED can be located below the encapsulation layer ENCAP.

The thickness T of the encapsulation layer ENCAP can be, for example, 1 μm or more.

Since the thickness of the encapsulation layer ENCAP is designed to be 1 μm or more as described above, parasitic capacitance generated between the second electrode E2 of the OLED and the touch electrodes TE can be reduced, thereby preventing touch sensitivity from being reduced by the parasitic capacitance.

As described above, each of the plurality of touch electrodes TE is patterned in the shape of a mesh, in which the electrode metal EM has two or more open areas OA. Each of the two or more open areas OA can correspond to one or more subpixels or the emitting areas thereof when viewed in a vertical direction.

As described above, the electrode metal EM of the touch electrode TE can be patterned such that the emitting area of one or more subpixels SP is provided in a position corresponding to each of the two or more open areas OA present in the area of the touch electrode TE when viewed in a plan view. Accordingly, the luminous efficiency of the display panel DISP can be improved.

As illustrated in FIGS. 10 and 11, a black matrix BM can be provided in the display panel DISP. The color filter CF can be further provided in the display panel DISP.

The position of the black matrix BM can correspond to the position of the electrode metal EM of the touch electrode TE.

The positions of the plurality of color filters CF correspond to the positions of the plurality of touch electrodes TE or the position of the plurality of open areas OA in the electrode metal EM constituting the plurality of touch electrodes TE.

Since the plurality of color filters CF are located in positions corresponding to the plurality of open areas OA as described above, the luminous performance of the display panel DISP can be improved.

The vertical positional relationship between the plurality of color filters CF and the plurality of touch electrodes TE will be described as follows.

As illustrated in FIG. 10, the plurality of color filters CF and the black matrix BM can be located on the plurality of touch electrodes TE.

In this case, the plurality of color filters CF and the black matrix BM can be located on the overcoat layer OC disposed on the plurality of touch electrodes TE. Here, the overcoat layer OC can be the same layer as or a different layer from the touch protective film PAC illustrated in FIG. 9.

Alternatively, as illustrated in FIG. 11, the plurality of color filters CF and the black matrix BM can be located below the plurality of touch electrodes TE.

In this case, the plurality of touch electrodes TE can be located on the overcoat layer OC on the plurality of color filters CF and the black matrix BM. The overcoat layer OC can be the same layer as or a different layer from the touch buffer film T-BUF or the touch insulating film T-ILD illustrated in FIG. 9. Alternatively, the touch buffer film T-BUF or the touch insulating film T-ILD can be disposed in a manner separate from the overcoat layer OC.

Due to the vertical positional relationship between the touch electrode TE and a display driving configuration being adjusted as described above, a touch sensing configuration can be disposed without degrading the display performance.

Furthermore, embodiments of the present disclosure can provide methods being capable of increasing the number of channels for driving the touch electrode TE easily, by a structure being capable of increasing the number of the touch pads TP disposed in the display panel DISP.

Figure 12:
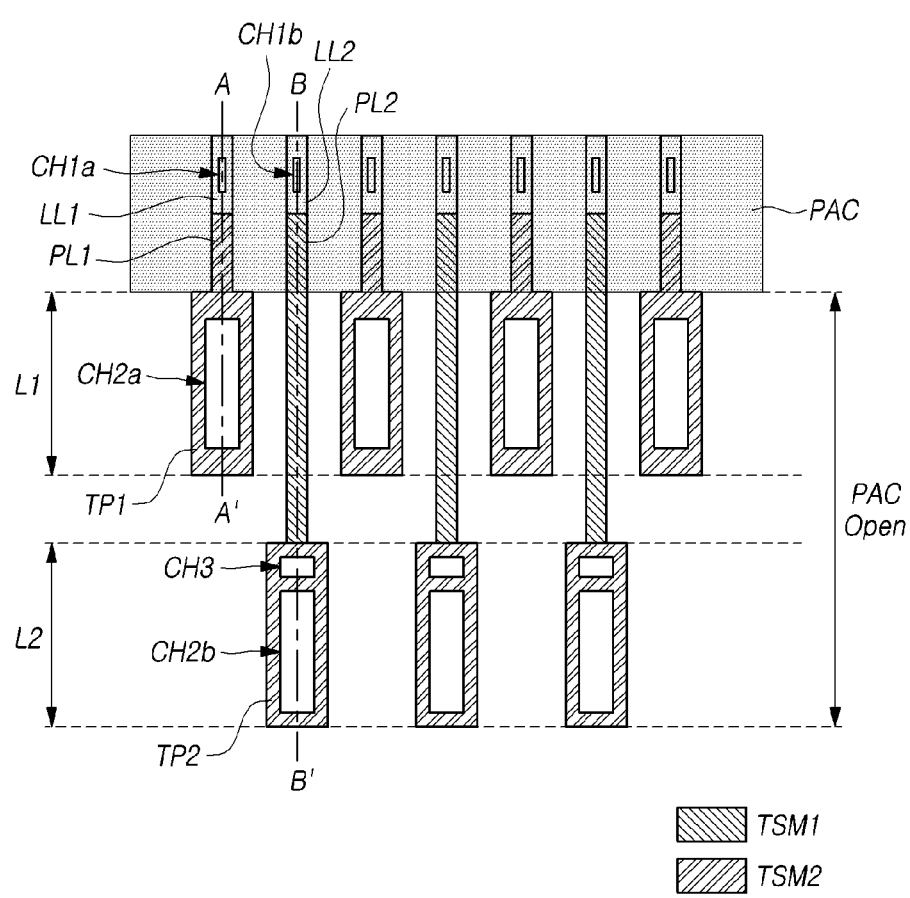
FIG. 12 is a diagram illustrating an example of a plane structure that a touch pad is disposed in a display panel according to embodiments of the present disclosure.

FIG. 12 is a diagram illustrating an example of a plane structure that the touch pad TP is disposed in the display panel according to embodiments of the present disclosure.

Referring to FIG. 12, it illustrates an example of an area where the touch pad TP is disposed outside a structure that a part of the non-active area NA of the display panel DISP is bent. Thus, FIG. 12 illustrates an area located outside of an area bent in the non-active area NA of the display panel DISP.

Referring to FIG. 12, a plurality of touch pads TP can be disposed on some area of the non-active area NA of the display panel DISP.

The plurality of touch pads TP can be the X-touch pad X-TP electrically connected to the X-touch routing line. Furthermore, the plurality of touch pads TP can be the Y-touch pad Y-TP electrically connected to the Y-touch routing line.

The plurality of touch pads TP can include a plurality of first touch pad TP1 disposed on a first line L1. The plurality of touch pads TP can include a plurality of second touch pads TP2 disposed on a second line L2.

The first line L1 can be an area more adjacent to the active area AA than the second line L2. The second line L2 can be an area more adjacent to an outer boundary of the non-active area NA than the first line L1.

Each of the plurality of first touch pads TP1 and each of the plurality of second touch pads TP2 can be disposed alternatively.

As the first touch pad TP1 and the second touch pad TP2 are disposed on different lines, a space between the touch pads TP can be reduced comparing to a case that all touch pads TP are disposed on a same line. Thus, the number of the touch pads TP disposed on a same area can be increased.

Each of the plurality of first touch pads TP1 and the plurality of second touch pads TP2 can be electrically connected to the touch routing line TL through a pad line PL and a touch link line LL.

The first touch pad TP1 can be electrically connected to a first pad line PL1. The first pad line PL1 can be electrically connected to a first touch link line LL1.

The second touch pad TP2 can be electrically connected to a second pad line PL2. The second pad line PL2 can be electrically connected to a second touch link line LL2.

The first touch link line LL1 and the second touch link line LL2 can be electrically connected to the touch routing line TL. The first touch link line LL1 and the second touch link line LL2 can have a same structure as a structure of the touch routing line TL. In some cases, the first touch link line LL1 and the second touch link line LL2 can have a different structure from a structure of the touch routing line TL.

The touch protective film PAC can be disposed on the pad line PL and the touch link line LL.

The touch protective film PAC can be disposed on at least some area of an area except for an area where the touch pad TP is disposed.

As the touch protective film PAC is not disposed on the touch pad TP, the touch pad TP can be electrically connected to the touch driving circuit TDC through a bonding process. And as the touch protective film PAC, such as an example (PAC Open area) illustrated in FIG. 12, is wholly removed in an area where the touch pad TP is disposed, a process defect due to a step difference in the bonding process can be prevented.

As the touch protective film PAC is not disposed entirely on an area where the touch pad TP is disposed, a portion of the second pad line PL2 can be located on an area where the touch protective film PAC is not disposed.

Embodiments of the present disclosure can provide methods being capable of maintaining a reliability in an area where the touch pad TP is disposed as the pad line PL is not exposed to outside even though the pad line PL is located on an area where the touch protective film PAC is not disposed.

For example, the first pad line PL1 electrically connected to the first touch pad TP1 can be disposed on a same layer as a layer where the first touch pad TP1 is disposed. The first pad line PL1 can be made of a same material as the first touch pad TP1.

The first touch pad TP1 can be made of a second touch sensor metal TSM2 disposed on the touch insulating film T-ILD. The first pad line PL1 can be made of the second touch sensor metal TSM2 same as the first touch pad TP1.

The touch protective film PAC can be disposed on the first pad line PL1. The first pad line PL1 can be located in an area overlapping with the touch protective film PAC. Thus, the first pad line PL1 may not be exposed to outside.

A part of outer boundary of the touch protective film PAC can overlap with an inner outer boundary connected to the first pad line PL1 among outer boundaries of the first touch pad TP1. As a part of the outer boundary of the touch protective film PAC is disposed to be aligned with the inner outer boundary of the first touch pad TP1, the first pad line PL1 may not be exposed to outside even though the first pad line PL1 is made of a metal disposed on a same layer as the first touch pad TP1.

The second pad line PL2 electrically connected to the second touch pad TP2 can be disposed on a different layer from a layer where the second touch pad TP2 is disposed.

The second touch pad TP2 can be made of the second touch sensor metal TSM2 disposed on the touch insulating film T-ILD. The second pad line PL2 can be made of a first touch sensor metal TSM1 disposed under the touch insulating film T-ILD.

As the second pad line PL2 is made of the first touch sensor metal TSM1, the touch insulating film T-ILD can be disposed on the second pad line PL2.

As the touch insulating film T-ILD is disposed on the second pad line PL2 in an area where the touch protective film PAC is not disposed, the second pad line PL2 may not be exposed to outside.

Thus, in a structure that the first touch pad TP1 and the second touch pad TP2 are disposed on different lines each other, all of the first pad line PL1 electrically connected to the first touch pad TP1 and the second pad line PL2 electrically connected to the second touch pad TP2 may not be exposed to outside.

Figure 13:
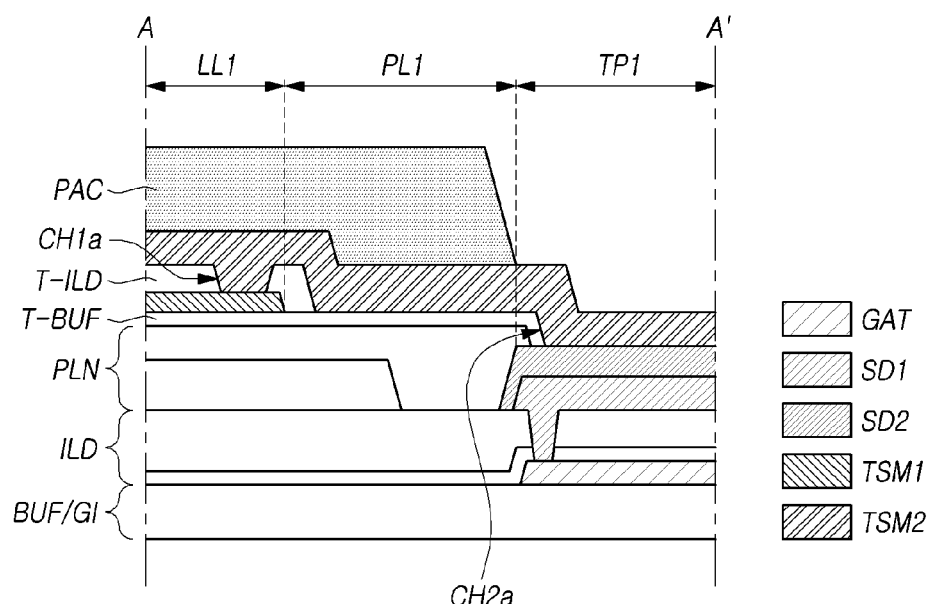
FIG. 13 is a diagram illustrating an example of a cross-sectional structure of a portion A-A' shown in FIG. 12.
Figure 14:
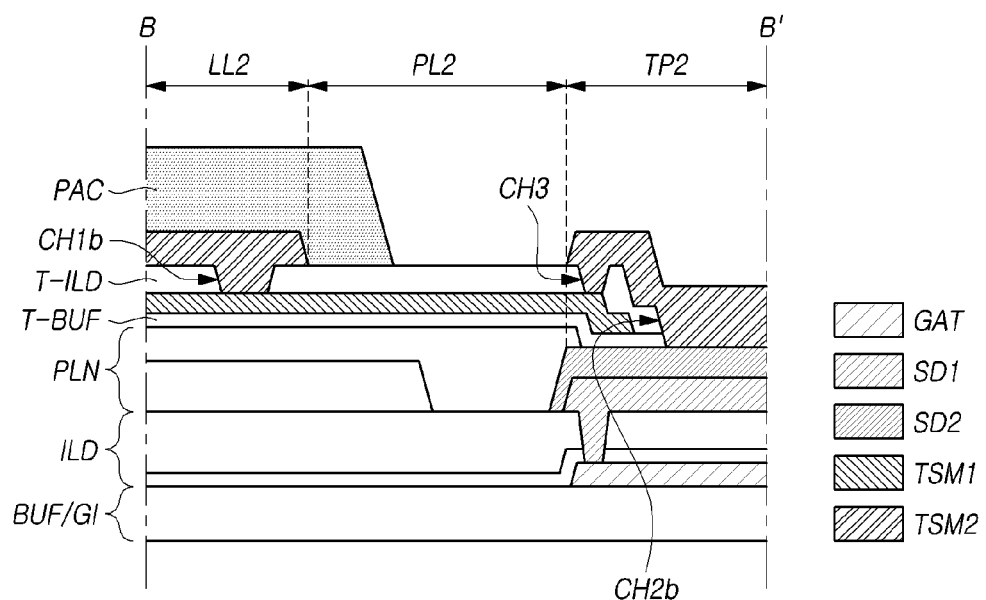
FIG. 14 is a diagram illustrating an example of a cross-sectional structure of a portion B-B' shown in FIG. 12.

FIG. 13 is a diagram illustrating an example of a cross-sectional structure of a portion A-A' shown in FIG. 12. FIG. 14 is a diagram illustrating an example of a cross-sectional structure of a portion B-B' shown in FIG. 12.

Referring to FIG. 13, at least one interlayer insulating film ILD can be disposed on a buffer film BUF and the gate insulating film GI. At least one planarization film PLN can be disposed on the interlayer insulating film ILD.

Each of the buffer film BUF, the gate insulating film GI, the interlayer insulating film ILD and the planarization film PLN can mean a same layer as a layer which is disposed in the active area AA.

The touch buffer film T-BUF can be disposed on the planarization film PLN.

The first touch sensor metal TSM1 can be disposed on the touch buffer film T-BUF, and the touch insulating film T-ILD can be disposed on the first touch sensor metal TSM1. The second touch sensor metal TSM2 can be disposed on the touch insulating film T-ILD, and the touch protective film PAC can be disposed on some area on the second touch sensor metal TSM2.

The touch buffer film T-BUF, the first touch sensor metal TSM1, the touch insulating film T-ILD, the second touch sensor metal TSM2 and the touch protective film PAC can be disposed in the active area similarly and can be used for implementing the touch sensing function.

The first touch link line LL1 can be made of the first touch sensor metal TSM1 and the second touch sensor metal TSM2. The first touch sensor metal TSM1 and the second touch sensor metal TSM2 constituting the first touch link line LL1 can be electrically connected to each other through a contact-hole CH1a made in the touch insulating film T-ILD.

The first touch link line LL1 can be a same structure as a structure of the touch routing line TL, and a resistance of the first touch link line LL1 can be reduced by a double-layer line structure.

The first pad line PL1 can be made of the second touch sensor metal TSM2.

The first touch sensor metal TSM1 may not be disposed under the first pad line PL1. Furthermore, the touch insulating film T-ILD may not be disposed under the first pad line PL1.

As the first pad line PL1 is made of the second touch sensor metal TSM2, the touch protective film PAC can be disposed on the first pad line PL1.

The first touch pad TP1 can be made of the second touch sensor metal TSM2.

The first touch pad TP1 can be electrically connected to at least one metal located under the planarization film PLN through a contact-hole CH2a. For example, the first touch pad TP1 can be electrically connected to a gate metal GAT, a first source drain metal SD1 and a second source drain metal SD2.

A resistance of the first touch pad TP1 can be reduced by using a metal which is disposed under the first touch pad TP1 for implementing a signal line or the like for a display driving.

The touch protective film PAC may not be disposed on the first touch pad TP1.

The touch protective film PAC can be disposed on the first touch link line LL1 and the first pad line PL1.

By a disposition structure of the touch protective film PAC, only the first touch pad TP1 can be exposed to outside, and the first touch link line LL1 and the first pad line PL1 may not be exposed to outside.

In the case that the first pad line PL1 electrically connected to the first touch pad TP1 is made of the second touch sensor metal TSM2 disposed on a same layer as a layer where the first touch pad TP1 is disposed, it can be prevented that the first pad line PL1 is exposed to an air, and a reliability can be maintained.

Referring to FIG. 14, a structure of the second pad line PL2 electrically connected to the second touch pad TP2 can be different from a structure of the first pad line PL1 electrically connected to the first touch pad TP1.

The first touch sensor metal TSM1, the touch insulating film T-ILD, the second touch sensor metal TSM2 and the touch protective film PAC can be disposed on the touch buffer film T-BUF sequentially.

The second touch link line LL2 can be made of the first touch sensor metal TSM1 and the second touch sensor metal TSM2. The first touch sensor metal TSM1 and the second touch sensor metal TSM2 constituting the second touch link line LL2 can be electrically connected to each other through a contact-hole CH1b made in the touch insulating film T-ILD.

Thus, a structure of the second touch link line LL2 can be same as a structure of the first touch link line LL1.

The second pad line PL2 can be made of the first touch sensor metal TSM1.

A part of the second pad line PL2 can be located on an area where the touch protective film PAC is disposed. Other part of the second pad line PL2 can be located on an area where the touch protective film PAC is not disposed.

The touch insulating film T-ILD can be disposed on the second pad line PL2.

The second pad line PL2 may not be exposed to outside by the touch insulating film T-ILD in an area where the touch protective film PAC is not disposed.

The second pad line PL2 can be electrically connected to the second touch pad TP2 made of the second touch sensor metal TSM2 by a contact-hole CH3 made in the touch insulating film T-ILD.

The second touch pad TP2 can be electrically connected to the gate metal GAT, the first source drain metal SD1 and the second source drain metal SD2 through a contact-hole CH2b.

Such as described above, as the touch pads TP are disposed on the plurality of lines alternatively, the number of the touch pads TP being capable of disposing can be increased.

Furthermore, in the case that the pad line PL electrically connected to the touch pad TP is made of a metal disposed on a same layer as a layer where the touch pad TP is disposed, an outside exposure of the pad line PL can be prevented by disposing the touch protective film PAC on the pad line PL.

In the case that at least a part of the pad line PL is disposed on an area where the touch protective film PAC is not disposed, as implementing the pad line PL by using a metal disposed on a different layer from a layer where the touch pad TP is disposed, an outside exposure of the pad line PL can be prevented.

Thus, as preventing to expose the pad line PL electrically connected to the touch pad TP to outside while increasing the number of the touch pads TP disposed in the display panel DISP, a reliability of the touch pad TP can be maintained.

Furthermore, an example illustrated in FIG. 12 illustrates an example of a structure that the touch pads TP are disposed on two lines alternatively, in some cases, the touch pads TP can be disposed on three or more lines alternatively. In the case that the touch pads TP are disposed on three or more lines alternatively, the touch pads TP disposed on at least two or more lines can be electrically connected to the pad line PL made of the first touch sensor metal TSM1.

Meanwhile, according to embodiments of the present disclosure, in some cases, as implementing all pad lines PL connected to the touch pad TP by using a metal disposed on a different layer from a layer where the touch pad TP is disposed, a degree of freedom of a disposition structure of the touch protective film PAC can be increased.

Figure 15:
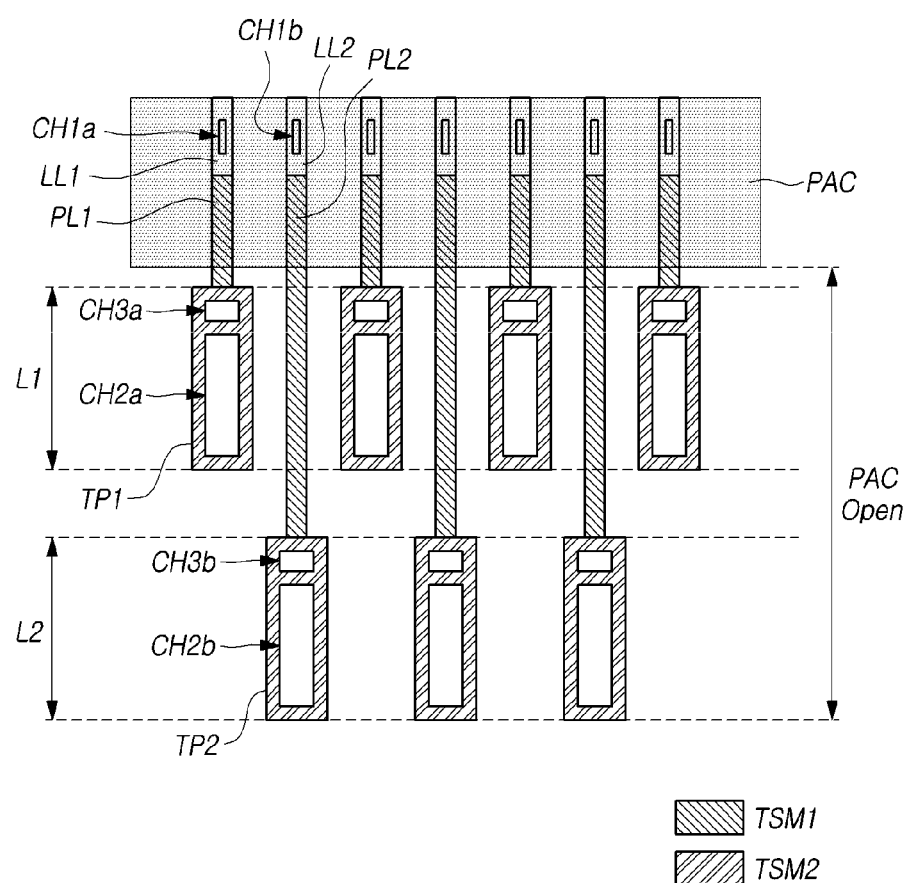
FIG. 15 is a diagram illustrating other example of a plane structure that a touch pad is disposed in a display panel according to embodiments of the present disclosure.

FIG. 15 is a diagram illustrating other example of a plane structure that the touch pad TP is disposed in the display panel DISP according to embodiments of the present disclosure.

Referring to FIG. 15, the plurality of first touch pad TP1 can be disposed on the first line L1 adjacent to an area where the touch link line LL is disposed. The plurality of second touch pad TP2 can be disposed on the second line L2 located farther from the area where the touch link line LL is disposed than the first line L1.

The first touch pad TP1 and the second touch pad TP2 can be disposed alternatively on an area where the touch protective film PAC is not disposed.

The first touch pad TP1 can be electrically connected to the first pad line PL1. The first pad line PL1 can be disposed on a different layer from a layer where the first touch pad TP1 is disposed.

For example, the first touch pad TP1 can be made of the second touch sensor metal TSM2 located on the touch insulating film T-ILD. The first pad line PL1 can be made of the first touch sensor metal TSM1 located under the touch insulating film T-ILD.

The first touch pad TP1 and the first pad line PL1 can be electrically connected to each other through a contact-hole CH3a made in the touch insulating film T-ILD.

The second touch pad TP2 can be electrically connected to the second pad line PL2. The second pad line PL2 can be disposed on a different layer from a layer where the second touch pad TP2 is disposed.

For example, the second touch pad TP2 can be made of the second touch sensor metal TSM2. The second pad line PL2 can be made of the first touch sensor metal TSM1.

The second touch pad TP2 and the second pad line PL2 can be electrically connected to each other through a contact-hole CH3b made in the touch insulating film T-ILD.

As all of the first pad line PL1 and the second pad line PL2 are made of the first touch sensor metal TSM1, the touch insulating film T-ILD can be disposed on the first pad line PL1 and the second pad line PL2.

The first pad line PL1 and the second pad line PL2 may not be exposed to outside by the touch insulating film T-ILD.

Thus, the first pad line PL1 and the second pad line PL2 can be located on an area where the touch protective film PAC is not disposed.

In this case, the touch protective film PAC can be disposed to be separated from the first touch pad TP1 disposed on the first line L1. A space (or a gap) can be present between the touch protective film PAC and the first touch pad TP1. A space between the touch protective film PAC and the first touch pad TP1 can be smaller than a space between the touch protective film PAC and the second touch pad TP2.

As disposing the touch protective film PAC to be separated from the first touch pad TP1 and the second touch pad TP2, a bonding process electrically connecting the touch driving circuit TDC to the touch pad TP can be performed more easily.

An example illustrated in FIG. 15 illustrates an example of a structure that the touch pads TP are disposed on two lines alternatively, in some cases, the touch pads TP can be disposed on three or more lines alternatively. In the case that the touch pads TP are disposed on three or more lines alternatively, the touch pads TP disposed on all lines can be electrically connected to the pad line PL made of the first touch sensor metal TSM1.

Furthermore, embodiments of the present disclosure can provide methods being capable of preventing a short between adjacent pad lines PL and reducing or minimizing a space between the touch pads TP, by differing layers where the adjacent pad lines PL are disposed.

Figure 16:
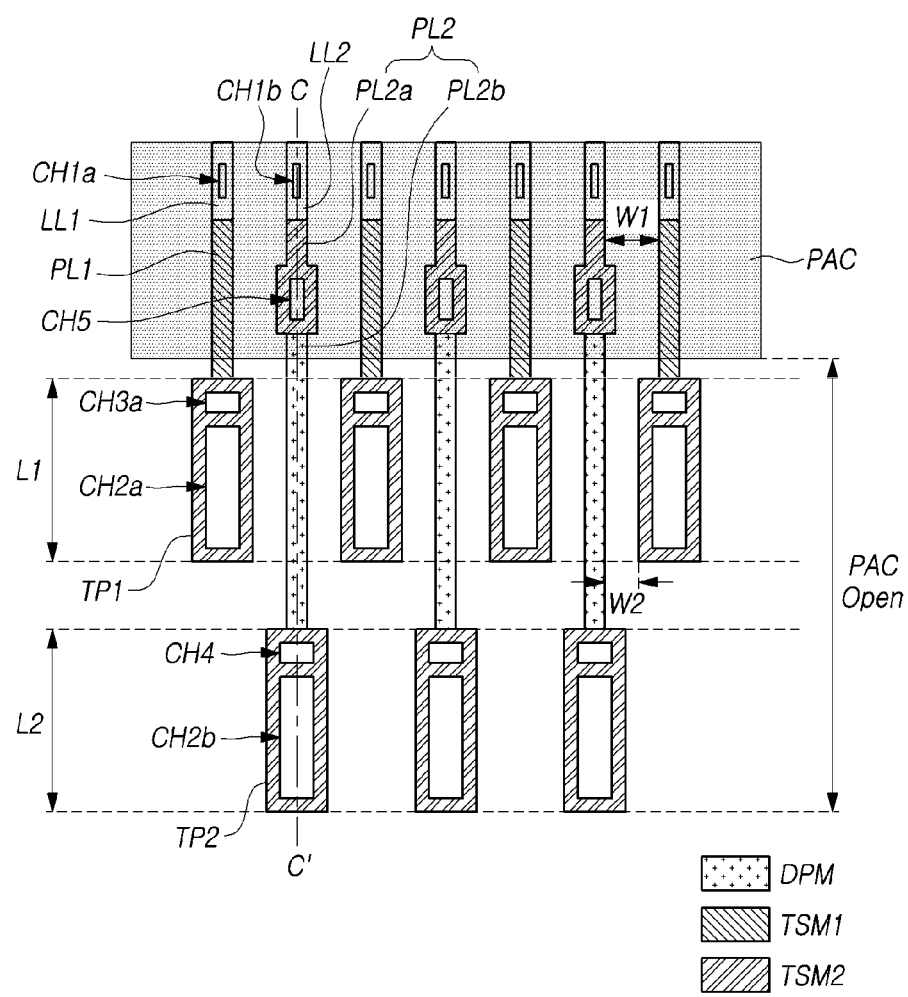
FIG. 16 is a diagram illustrating still other example of a plane structure that a touch pad is disposed in a display panel according to embodiments of the present disclosure.
Figure 17:
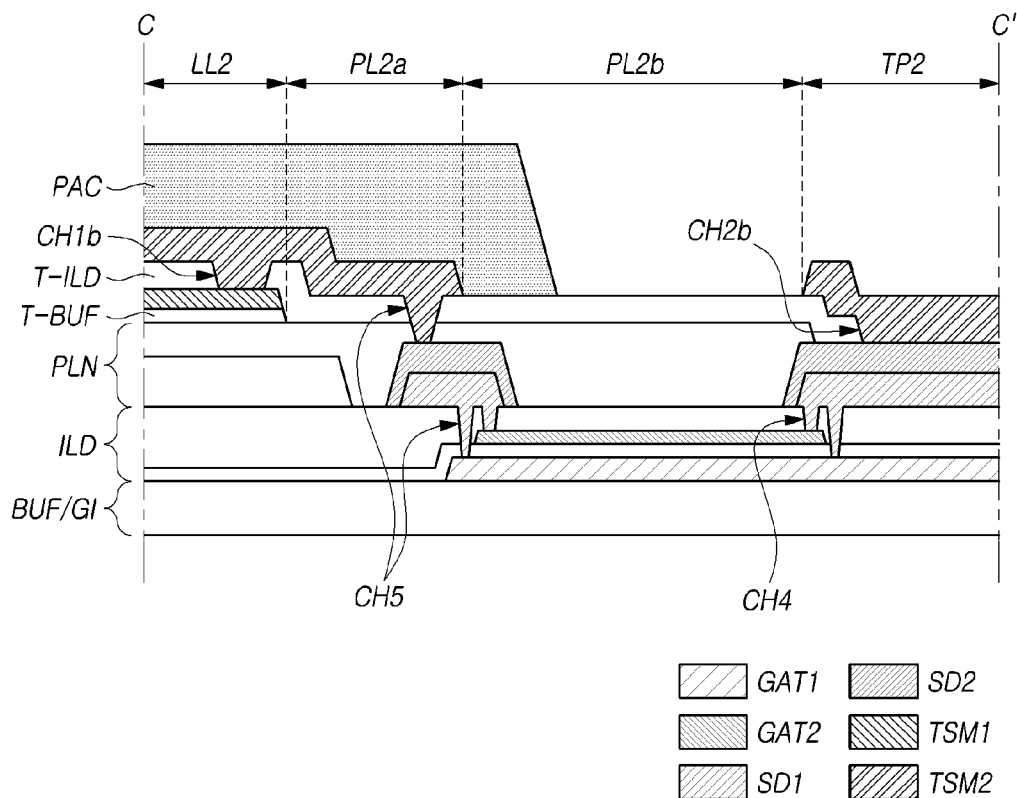
FIG. 17 is a diagram illustrating an example of a cross-sectional structure of a portion C-C' shown in FIG. 16.

FIG. 16 is a diagram illustrating still other example of a plane structure that the touch pad TP is disposed in the display panel DISP according to embodiments of the present disclosure. FIG. 17 is a diagram illustrating an example of a cross-sectional structure of a portion C-C' shown in FIG. 16.

Referring to FIG. 16, the plurality of first touch pads TP1 can be disposed on the first line L1. The plurality of second touch pads TP2 can be disposed on the second line L2.

Each of the plurality of first touch pads TP1 can be electrically connected to the first pad line PL1. The first pad line PL1 can be electrically connected to the first touch link line LL1.

Each of the plurality of second touch pads TP2 can be electrically connected to the second pad line PL2. The second pad line PL2 can be electrically connected to the second touch link line LL2.

The first touch pad TP1 and the second touch pad TP2 can be made of the second touch sensor metal TSM2 located on the touch insulating film T-ILD.

The first pad line PL1 can be made of the first touch sensor metal TSM1 located under the touch insulating film T-ILD.

As the first pad line PL1 is located under the touch insulating film T-ILD, the first pad line PL1 may not be exposed to outside even though a part of the first pad line PL1 is located on an area where the touch protective film PAC is not disposed.

The second pad line PL2 can include a first portion PL2a and a second portion PL2b.

The first portion PL2a of the second pad line PL2 can be electrically connected to the second touch link line LL2.

The second portion PL2b of the second pad line PL2 can be electrically connected to the first portion PL2a. The second portion PL2b of the second pad line PL2 can be electrically connected to the second touch pad TP2.

A layer where the first portion PL2a of the second pad line PL2 is disposed can be different from a layer where the second portion PL2b of the second pad line PL2 is disposed.

Furthermore, the layer where the first portion PL2a of the second pad line PL2 is disposed and the layer where the second portion PL2b of the second pad line PL2 is disposed can be different from a layer where the first pad line PL1 is disposed.

For example, the first portion PL2a of the second pad line PL2 can be disposed on a same layer as a layer where the second touch pad TP2 is disposed. Thus, the first portion PL2a of the second pad line PL2 can be made of the second touch sensor metal TSM2.

The first portion PL2a of the second pad line PL2 can be located on an area where the touch protective film PAC is disposed. The first portion PL2a of the second pad line PL2 may not be exposed to outside by the touch protective film PAC.

A length of the first portion PL2a of the second pad line PL2 can be smaller than a length of the first pad line PL1. As a length of the first portion PL2a of the second pad line PL2 made of the second touch sensor metal TSM2 is smaller than a length of the first pad line PL1 made of the first touch sensor metal TSM1, the touch protective film PAC can be disposed to be separated from the first touch pad TP1.

The second portion PL2b of the second pad line PL2 can be made of at least one of a display electrode metal DPM located under the touch buffer film T-BUF.

At least a part of the second portion PL2b of the second pad line PL2 can be located on an area where the touch protective film PAC is not disposed. As the second portion PL2b of the second pad line PL2 is made of the display electrode metal DPM, the second portion PL2b of the second pad line PL2 may not be exposed to outside even though the second portion PL2b of the second pad line PL2 is disposed on an area where the touch protective film PAC is not disposed.

An example of a structure of the second pad line PL2 would be described referring to FIG. 17. As shown in FIG. 17, the second touch link line LL2 electrically connected to the second pad line PL2 can be made of the first touch sensor metal TSM1 and the second touch sensor metal TSM2.

The first touch sensor metal TSM1 and the second touch sensor metal TSM2 constituting the second touch link line LL2 can be electrically connected to each other through a contact-hole CH1b made in the touch insulating film T-ILD.

The first portion PL2a of the second pad line PL2 can be made of the second touch sensor metal TSM2. The first portion PL2a of the second pad line PL2 can be disposed not to get out an area where the touch protective film PAC is disposed.

The first portion PL2a of the second pad line PL2 can be electrically connected to the second portion PL2b of the second pad line PL2 through a contact-hole CH5.

The second portion PL2b of the second pad line P12 can be implemented by using at least one display electrode metal DPM.

An example illustrated in FIG. 17 illustrates a case that the second portion PL2b of the second pad line PL2 is made of a first gate metal GAT1, a second gate metal GAT2, the first source drain metal SD1 and the second source drain metal SD2.

The first gate metal GAT1, the second gate metal GAT2, the first source drain metal SD1 and the second source drain metal SD2 can be one of metals used for implementing a signal line or a circuit element in the active area AA or the non-active area NA.

At least a part of the second portion PL2b of the second pad line PL2 can be located on an area where the touch protective film PAC is not disposed.

As the second portion PL2b of the second pad line PL2 is electrically connected to the first portion PL2a of the second pad line PL2 and the touch protective film PAC is disposed on the first portion PL2a of the second pad line PL2, a part of the second portion PL2b of the second pad line PL2 can be located on an area where the touch protective film PAC is disposed.

The second touch pad TP2 can be made of the second touch sensor metal TSM2 and be exposed to outside.

The second touch pad TP2 can be electrically connected to the second portion PL2b of the second pad line PL2 through the display electrode metal DPM.

As implementing a part of the second pad line PL2 located on an area where the touch protective film PAC is not located by using the display electrode metal DPM, it can be prevented that the second pad line PL2 is exposed to outside.

Furthermore, as implementing the first pad line PL1 and the second pad line PL2 by using metals disposed on different layers, a short between adjacent pad lines PL can be prevented.

Referring to FIG. 16, a space W2 between the first touch pad TP1 and the second portion PL2b of the second pad line PL2 can be smaller than a space W1 between the first pad line PL1 and the first portion PL2a of the second pad line PL2.

As the first touch pad TP1 is electrically connected to the first pad line PL1 made of the first touch sensor metal TSM1 through a contact-hole CH3a, the first pad line PL1 can be located under the first touch pad TP1.

In a case that the second portion PL2b of the second pad line PL2 located between adjacent first touch pads TP1 is disposed on a same layer as a layer where the first pad line PL1 is disposed, a certain space between the first touch pad TP1 and the second portion PL2b of the second pad line PL2 may be beneficial for preventing a short between the second portion PL2b of the second pad line PL2 and the first pad line PL1.

On the other hand, as disposing the second portion PL2b of the second pad line PL2 on a different layer from a layer where the first pad line PL1 is disposed, a space between the touch pads TP can be reduced or minimized while preventing a short between adjacent pad lines PL.

Furthermore, as disposing the first portion PL2a of the second pad line PL2 on a different layer from a layer where the first pad line PL1 is disposed also, a short defect between adjacent pad lines PL can be reduced or minimized.

An example illustrated in FIG. 16 illustrates an example of a structure that the touch pads TP are disposed on two lines alternatively, in some cases, the touch pads TP can be disposed on three or more lines alternatively. In the case that the touch pads TP are disposed on three or more lines alternatively, at least a part of the pad line PL electrically connected to the touch pad TP disposed on at least two or more lines can be made of the display electrode metal DPM.

Embodiments of the present disclosure can increase the number of touch pads TP being capable of disposing while maintaining a reliability, as a metal other than the touch pad TP is not exposed on an area where the touch pad TP is disposed.

Furthermore, by differing layers where adjacent pad lines PL are disposed, a space between the touch pads TP can be reduced or minimized while preventing a short between adjacent pad lines PL.

Furthermore, according to implementing the pad line PL using a plurality of layers, since the touch pads TP can be disposed on more lines than two lines, the number of the touch pads TP being capable of disposing can be increased.

Figure 18:
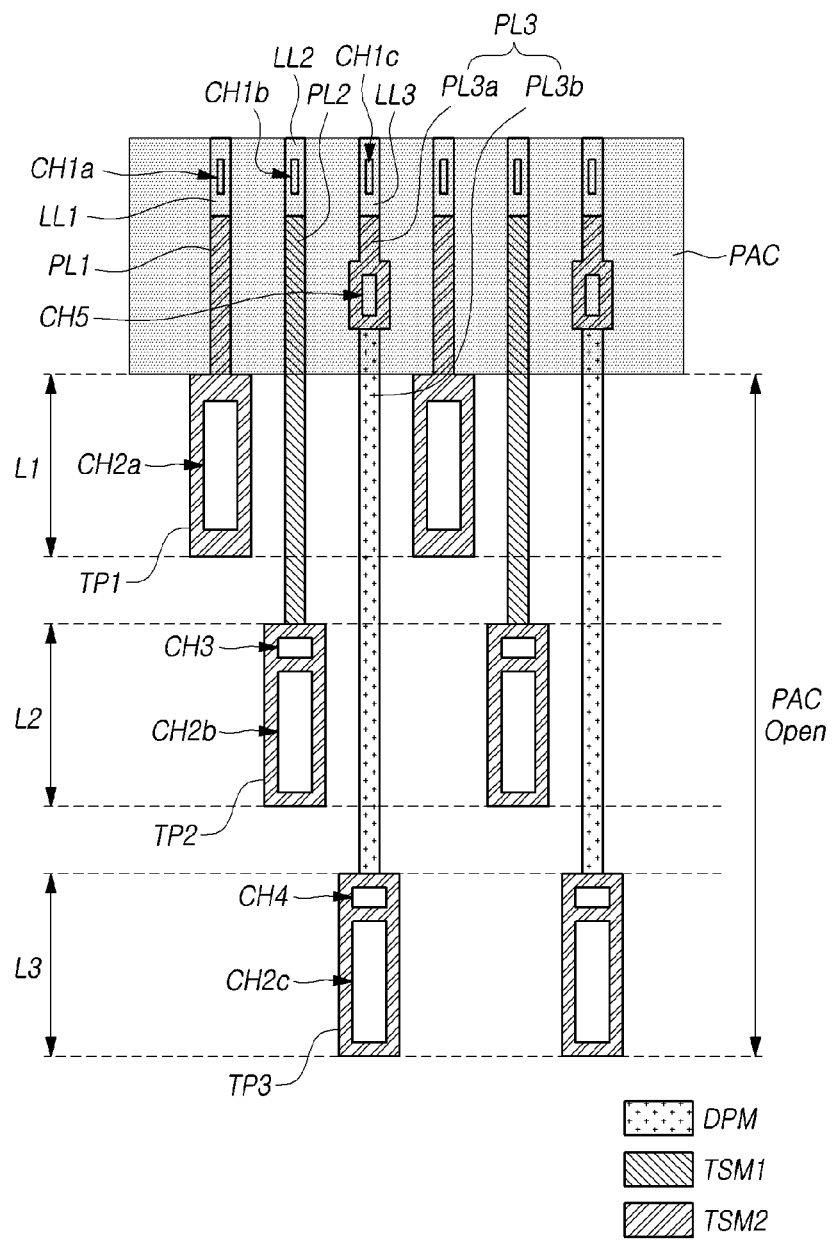
FIG. 18 is a diagram illustrating still other example of a plane structure that a touch pad is disposed in a display panel according to embodiments of the present disclosure.

FIG. 18 is a diagram illustrating still other example of a plane structure that the touch pad TP is disposed in the display panel DISP according to embodiments of the present disclosure.

Referring to FIG. 18, the plurality of touch pads TP can include the plurality of first touch pads TP1 disposed on the first line L1.

The plurality of touch pads TP can include the plurality of second touch pads TP2 disposed on the second line L2 located farther from the touch link line LL than the first line L1.

Furthermore, the plurality of touch pads TP can include a plurality of third touch pads TP3 disposed on a third line L3 located farther from the touch link line LL than the second line L2.

The first touch pad TP1, the second touch pad TP2 and the third touch pad TP3 can be disposed on a same layer, and can be made of the second touch sensor metal TSM2.

The touch protective film PAC may not be disposed on an area where the first touch pad TP1, the second touch pad TP2 and the third touch pad TP3 are disposed. Thus, the first touch pad TP1, the second touch pad TP2 and the third touch pad TP3 can be exposed to outside.

The first pad line PL1 electrically connected to the first touch pad TP1 can be disposed on a same layer as a layer where the first touch pad TP1 is disposed. The first pad line PL1 can be made of the second touch sensor metal TSM2. The touch protective film PAC can be disposed on the first pad line PL1.

A part of outer boundary of the touch protective film PAC can overlap an inner outer boundary adjacent to the first pad line PL1 among outer boundaries of the first touch pad TP1.

As the first pad line PL1 is located in an area overlapping with the touch protective film PAC, the first pad line PL1 may not be exposed to outside.

The second pad line PL2 electrically connected to the second touch pad TP2 can be disposed on a different layer from a layer where the second touch pad TP2 is disposed. The second pad line PL2 can be made of the first touch sensor metal TSM1.

Although a part of the second pad line PL2 is located on an area where the touch protective film PAC is not disposed, but the touch insulating film T-ILD is disposed on the second pad line PL2, the second pad line PL2 may not be exposed to outside.

As the second pad line PL2 is disposed on a different layer from a layer where the first pad line PL1 is disposed, a short between the first pad line PL1 and the second pad line PL2 located adjacently can be prevented.

A third pad line PL3 electrically connected to the third touch pad TP3 can include a first portion PL3a disposed on a same layer as a layer where the third touch pad TP3 is disposed and a second portion PL3b disposed on a different layer from a layer where the third touch pad TP3 is disposed.

The first portion PL3a of the third pad line PL3 can be made of the second touch sensor metal TSM2. The second portion PL3b of the third pad line PL3 can be made of the display electrode metal DPM.

The first portion PL3a of the third pad line PL3 can be located in an area where the touch protective film PAC is disposed. And as the second portion PL3b of the third pad line PL3 is made of the display electrode metal DPM, the third pad line PL3 may not be exposed to outside.

As the second portion PL3b of the third pad line PL3 is located on a different layer from a layer where the first pad line PL1 and the second pad line PL2 are disposed, a short with adjacent pad line PL can be prevented.

The first portion PL3a of the third pad line PL3 can be disposed on a layer where the first pad line PL1 is disposed. As an area where the first portion PL3a of the third pad line PL3 is disposed is an area where the touch pad TP is not disposed, a space between the pad lines PL has a margin.

Thus, a short between the third pad line PL3 and adjacent pad line PL or the touch pad TP can be prevented.

Furthermore, in a structure that the touch pads TP are disposed on three or more lines, the pad line PL electrically connected to the touch pad TP disposed on two or more lines can be disposed on a same layer.

For example, the first touch pad TP1 disposed on the first line L1 can be electrically connected to the first pad line PL1 made of the second touch sensor metal TSM2.

The second touch pad TP2 disposed on the second line L2 can be electrically connected to the second pad line PL2 made of the first touch sensor metal TSM1. And the third touch pad TP3 disposed on the third line L3 can be electrically connected to the third pad line PL3 made of the first touch sensor metal TSM1 such as the second pad line PL2.

Alternatively, the second touch pad TP2 can be electrically connected to the second pad line PL2 at least partially made of the display electrode metal DPM. Furthermore, the third touch pad TP3 can be electrically connected to the third pad line PL3 at least partially made of the display electrode metal DPM.

For another example, the first touch pad TP1 disposed on the first line L1 can be electrically connected to the first pad line PL1 made of the first touch sensors metal TSM1.

The second touch pad TP2 disposed on the second line L2 can be electrically connected to the second pad line PL2 made of the first touch sensor metal TSM1. And the third touch pad TP3 disposed on the third line L3 can be electrically connected to the third pad line PL3 made of the first touch sensor metal TSM1.

Alternatively, at least one of the second pad line PL2 and the third pad line PL3 can include a portion made of the display electrode metal DPM. Thus, a part of one or two of the pad lines PL electrically connected to the touch pads TP disposed on three lines can be made of the display electrode metal DPM.

Although above-mentioned examples describe a case that lines which the touch pads TP are disposed are two and three as an example, the touch pads TP, in some cases, can be disposed on three or more lines alternatively. The pad line PL electrically connected to the touch pad TP, in a structure that the pad line PL is not exposed to outside, can be disposed to be made of various combinations of the above-mentioned touch sensor metal TSM or the display electrode metal DPM.

According to various embodiments of the present disclosure, as the touch pads TP are disposed on the plurality of lines alternatively, a space between the touch pads TP can be reduced, and the number of the touch pads TP being capable of disposing can be increased.

Furthermore, in a structure that the touch pads TP are disposed on the plurality of lines alternatively, by a structure that the pad line PL electrically connected to the touch pad TP is not exposed to outside, a reliability of the touch pad TP can be maintained.

Furthermore, as differing layers where adjacent pad lines PL are disposed, a short between adjacent pad lines PL or touch pads TP can be reduced to reduce or minimize a space between the touch pads TP, an increase of the number of channels can be implemented easily in a large size of the touch display device.

The above description has been presented to enable any person skilled in the art to make and use the technical idea of the present disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present disclosure. The above description and the accompanying drawings provide an example of the technical idea of the present disclosure for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure should be construed based on the following claims, and all technical ideas within the scope of equivalents thereof should be construed as being included within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A touch display device, comprising:
a display panel having thereon an active area;
an encapsulation layer on the active area;
a transistor under the encapsulation layer, the transistor including a gate electrode, and a source or drain electrode;
a plurality of touch electrodes on an active area of the display panel, and disposed on the encapsulation layer;
a plurality of touch link lines located outside of the active area, and electrically coupled to at least one of the plurality of touch electrodes;
a plurality of pad lines electrically coupled to each of the plurality of touch link lines; and
a plurality of touch pads electrically coupled to each of the plurality of pad lines,
wherein the plurality of touch pads include:
a plurality of first touch pads located on a first region, and electrically coupled to each of a plurality of first pad lines among the plurality of pad lines, the plurality of first pad lines and the plurality of first touch pads disposed on a same layer; and
a plurality of second touch pads located on a second region located farther from the plurality of touch link lines than the first region, and electrically coupled to each of a plurality of second pad lines among the plurality of pad lines, the plurality of second pad lines each at least partially disposed on a layer different from a layer where the plurality of second touch pads are disposed and different from the layer where the plurality of first pad lines are disposed, and the plurality of second touch pads disposed on the same layer as the plurality of first touch pads,
wherein the plurality of first touch pads are in a same layer as the source or drain electrode of the transistor, and
wherein the touch display device further comprises a first insulation layer between the layer of the plurality of first pad lines and the layer of the plurality of second pad lines.

2. The touch display device of claim 1, wherein the plurality of first pad lines and the plurality of second pad lines are not exposed to outside.

3. The touch display device of claim 1, wherein the plurality of first pad lines are disposed on a same layer as a layer where at least a portion of the plurality of touch link lines is disposed.

4. The touch display device of claim 3, further comprising:
a touch protective film disposed on at least some area on the plurality of first pad lines and the plurality of second pad lines, and
wherein the plurality of first pad lines are located in an area overlapping with the touch protective film.

5. The touch display device of claim 4, wherein:
the touch protective film is disposed on at least some area of an area except for an area where the plurality of first touch pads are disposed, and
a part of an outer boundary of the touch protective film overlaps an inner outer boundary adjacent to the plurality of first pad lines among an outer boundary of each of the plurality of first touch pads.

6. The touch display device of claim 4, further comprising:
a touch insulating film disposed on the second pad line in an area where the touch protective film is not disposed.

7. The touch display device of claim 1, wherein the plurality of second pad lines are disposed on a different layer from a layer where the plurality of first pad lines are disposed.

8. The touch display device of claim 1, wherein each of the plurality of second pad lines each comprising:
a first portion disposed on the layer where the plurality of second touch pads are disposed.

9. The touch display device of claim 1, wherein the plurality of touch pads further comprising:
a plurality of third touch pads located on a third region located farther from the plurality of touch link lines than the second region, electrically coupled to each of a plurality of third pad lines among the plurality of pad lines, and at least a portion of the plurality of third pad lines is disposed on a different layer from a layer where the plurality of first pad lines are disposed and a layer where the plurality of second pad lines are disposed.

10. A touch display device, comprising:
a plurality of touch electrodes located on an active area of a display panel, and disposed on an encapsulation layer disposed on the active area;
a transistor under the encapsulation layer, the transistor including a gate electrode and a source or drain electrode;
a plurality of touch link lines located outside of the active area, and electrically coupled to at least one of the plurality of touch electrodes;
a plurality of pad lines electrically coupled to each of the plurality of touch link lines; and
a plurality of touch pads electrically coupled to each of the plurality of pad lines,
wherein the plurality of touch pads include:
a plurality of first touch pads located on a first region, and electrically coupled to each of a plurality of first pad lines among the plurality of pad lines, disposed on a first layer that is a same layer as a layer where the first touch pad is disposed;
a plurality of second touch pads located on a second region located farther from the plurality of touch link lines than the first region, and electrically coupled to each of a plurality of second pad lines among the plurality of pad lines, the plurality of second pad lines each at least partially disposed on a layer different from a layer where the plurality of second touch pads are disposed and different from the layer where the plurality of first pad lines are disposed, and the plurality of second touch pads disposed on the same layer as the plurality of first touch pads; and
a plurality of third touch pads located on a third region located farther from the plurality of touch link lines than the second region, and electrically coupled to each of a plurality of third pad lines, among the plurality of pad lines, including a first portion disposed on a same layer as a layer where at least one of the plurality of first pad lines and the plurality of second pad lines is disposed and a second portion disposed on a different layer from a layer where the plurality of first pad lines and the plurality of second pad lines are disposed,
wherein the plurality of first touch pad are in a same layer as the gate electrode of the transistor, and
wherein the touch display device further comprises a first insulation layer between the first layer and the second layer.

11. The touch display device of claim 10, further comprising:
a touch protective film located on the plurality of touch link lines, and disposed on at least some area of an area except for an area where the plurality of touch pads are disposed, and
a part of an outer boundary of the touch protective film overlaps an inner outer boundary adjacent to the plurality of first pad lines among an outer boundary of each of the plurality of first touch pads.

12. The touch display device of claim 11, wherein an outer boundary of the touch protective film is separated from an outer boundary of each of the plurality of second touch pads and the plurality of third touch pads.

13. The touch display device of claim 12, further comprising:
a touch insulating film disposed on the second pad line in an area where the touch protective film is not disposed.

14. The touch display device of claim 12, wherein the second portion is electrically coupled to the corresponding third touch pad and disposed on a same layer as a layer where at least one of a display electrode disposed under the encapsulation layer in the active area is disposed.

15. The touch display device of claim 1, further comprising at least one dam structure outside the active area, wherein the encapsulation layer includes a portion that is disposed on the at least one dam structure.

16. The touch display device of claim 15, wherein the plurality of touch pads are disposed outside of the at least one dam structure.

17. The touch display device of claim 1, wherein a touch pad of the plurality of touch pads includes a first layer and a second layer, and an insulation layer between the first layer and the second layer, the first layer in contact with the second layer through a contact hole in the insulation layer.

18. The touch display device of claim 17, wherein first layer is the same layer as the source or drain electrode, and the second layer is a same layer as the gate electrode of the transistor.

19. The touch display device of claim 1, wherein the first touch pad and the first pad line are continuous and contiguous to each other.

20. A touch display device, comprising:
a display panel having thereon an active area;
an encapsulation layer on the active area;
a plurality of touch electrodes on an active area of the display panel, and disposed on the encapsulation layer;
a plurality of touch link lines located outside of the active area, and electrically coupled to at least one of the plurality of touch electrodes;
a plurality of pad lines electrically coupled to each of the plurality of touch link lines; and
a plurality of touch pads electrically coupled to each of the plurality of pad lines,
wherein the plurality of touch pads include:
a plurality of first touch pads located on a first region, and electrically coupled to each of a plurality of first pad lines, among the plurality of pad lines, disposed on a same layer as a layer where at least a portion of the plurality of touch link lines is disposed; and
a plurality of second touch pads located on a second region located farther from the plurality of touch link lines than the first region, and electrically coupled to each of a plurality of second pad lines, among the plurality of pad lines, disposed on a different layer from a layer where the plurality of first pad lines are disposed,
wherein each of the plurality of second pad lines comprises:

a first portion disposed on a same layer as a layer where the plurality of second touch pads are disposed and a second portion disposed on a different layer from the layer where the plurality of second touch pads are disposed.

21. The touch display device of claim 20, further comprising:
a touch protective film disposed on at least some area on the plurality of first pad lines and the plurality of second pad lines, and
wherein the first portion is located in an area overlapping with the touch protective film.

22. The touch display device of claim 20, wherein a length of the first portion is smaller than a length of the first pad line.

23. The touch display device of claim 20, wherein the second portion is electrically coupled to a corresponding second touch pad and disposed on a same layer as a layer where at least one of a display electrode disposed under the encapsulation layer in the active area is disposed.

24. The touch display device of claim 20, wherein a part of the second portion is located between adjacent first touch pads of the plurality of first touch pads.

25. The touch display device of claim 24, wherein a space between the second portion and the first touch pad is smaller than a space between the first portion and the first pad line.

* * * * *